US009910953B2

(12) United States Patent
Adel et al.

(10) Patent No.: US 9,910,953 B2
(45) Date of Patent: Mar. 6, 2018

(54) METROLOGY TARGET IDENTIFICATION, DESIGN AND VERIFICATION

(71) Applicant: KLA-Tencor Corporation, Milpitas, CA (US)

(72) Inventors: Michael Adel, Zichron Ya'akov (IL); Tal Shusterman, Haifa (IL); Chen Dror, Tivon (IL); Ellis Chang, Saratoga, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/356,551

(22) PCT Filed: Mar. 4, 2014

(86) PCT No.: PCT/US2014/020303
§ 371 (c)(1),
(2) Date: May 6, 2014

(87) PCT Pub. No.: WO2014/138057
PCT Pub. Date: Sep. 12, 2014

(65) Prior Publication Data
US 2016/0196379 A1    Jul. 7, 2016

Related U.S. Application Data

(60) Provisional application No. 61/811,047, filed on Apr. 11, 2013, provisional application No. 61/772,513, filed on Mar. 4, 2013.

(51) Int. Cl.
*G06F 17/50* (2006.01)
*H01L 21/66* (2006.01)
(Continued)

(52) U.S. Cl.
CPC ............ *G06F 17/5081* (2013.01); *G03F 1/36* (2013.01); *G03F 7/70625* (2013.01);
(Continued)

(58) Field of Classification Search
CPC ......... G06T 2207/30148; G06T 7/0004; G06T 7/0006; G01N 21/9501; G01N 21/956;
(Continued)

(56) References Cited

U.S. PATENT DOCUMENTS 7,631,286 B2    12/2009  Piper et al.
7,873,504 B1 *   1/2011  Bevis ................... G03F 1/36
                                                356/252

(Continued)

*Primary Examiner* — Nghia Doan
(74) *Attorney, Agent, or Firm* — Suiter Swantz pc llo

(57) ABSTRACT

A metrology design and verification framework is provided, which includes methods and systems for metrology structure identification in an integrated circuit design data block, design rule checking, hierarchal design of metrology target structures to minimize random errors, and metrology design rule verification of metrology target design files. In-die metrology targets are identified using various filtering methods and/or designed as hierarchical structure within dies or outside the dies. Particularly, metrology target design files are generated, which are hierarchical in structure and compatible with design rule checks. Design rule check takes into account the hierarchical and often repetitive target designs in the verification process. Layouts may be verified using design rule checks at different levels of design rules, which may be combined to remove rule violations and errors prior to actual target production.

25 Claims, 20 Drawing Sheets

(51) Int. Cl.
    *G03F 1/36*    (2012.01)
    *G03F 7/20*    (2006.01)
(52) U.S. Cl.
    CPC ...... *G03F 7/70633* (2013.01); *G03F 7/70683* (2013.01); *H01L 22/12* (2013.01); *H01L 22/30* (2013.01)
(58) Field of Classification Search
    CPC ......... G01N 21/8806; G01N 2201/127; G01N 2223/6116; G01N 21/9505; G01N 2201/11; G06F 17/5081; G06F 17/50; G06F 17/5009
    See application file for complete search history.

(56) References Cited

U.S. PATENT DOCUMENTS

| | | |
|---|---|---|
| 7,925,486 B2 | 4/2011 | Smith et al. |
| 8,214,771 B2 | 7/2012 | Adel et al. |
| 9,151,712 B1 * | 10/2015 | Adel ................. G01N 21/47 |
| 2003/0229410 A1 | 12/2003 | Smith et al. |
| 2004/0102934 A1 * | 5/2004 | Chang ................ G03F 7/70625 703/1 |
| 2004/0148049 A1 | 7/2004 | Schwarm |
| 2005/0076316 A1 | 4/2005 | Pierrat et al. |
| 2005/0132306 A1 * | 6/2005 | Smith ................. G06F 17/5068 716/114 |
| 2012/0123748 A1 | 5/2012 | Aben et al. |
| 2013/0110477 A1 | 5/2013 | Pandev |
| 2013/0262044 A1 | 10/2013 | Pandev et al. |
| 2014/0347666 A1 * | 11/2014 | Veldman ............. G01N 21/211 356/369 |

\* cited by examiner

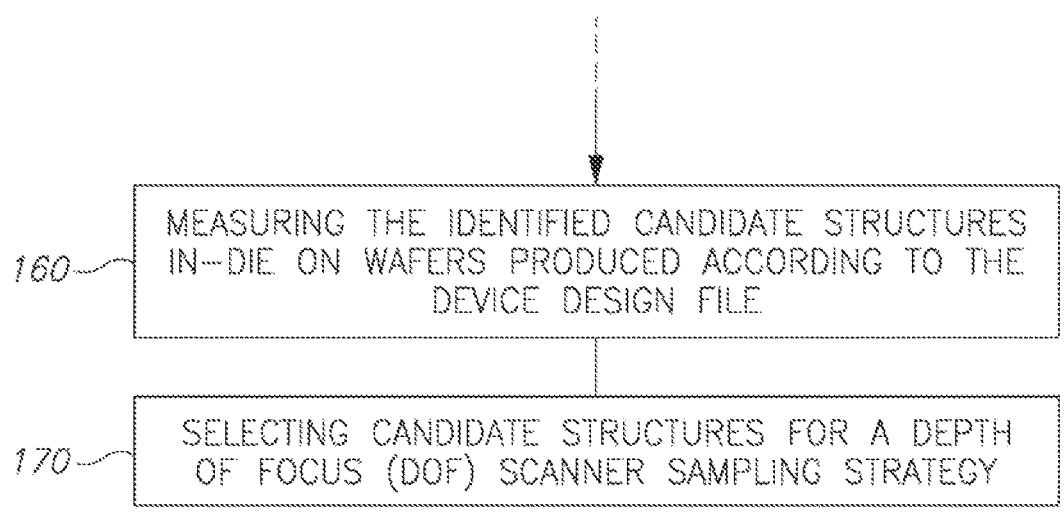
Figure 1B (cont. 1)

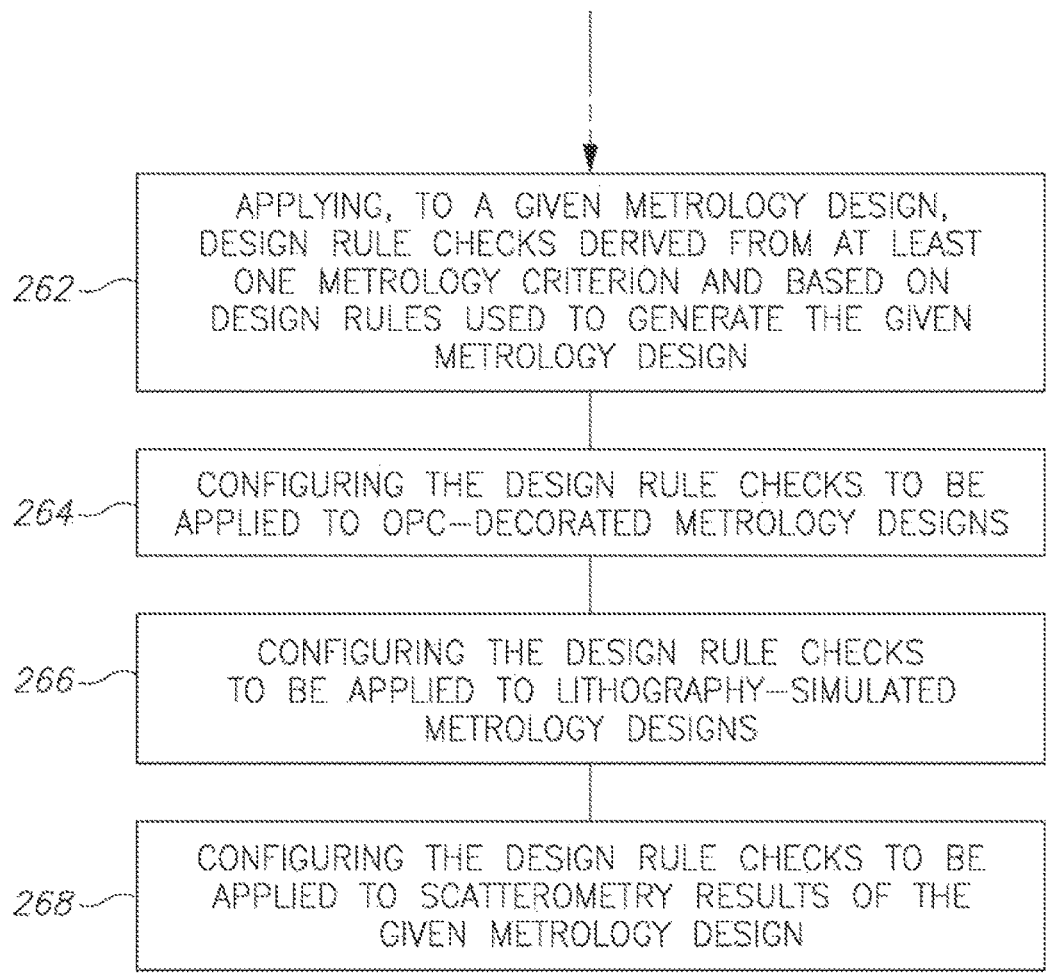
Figure 2B (cont. 1)

_401_

411 — DEFINING AT LEAST ONE TARGET STRUCTURE ELEMENT

421 — DEFINING TARGET STRUCTURES USING REPETITIONS OF THE AT LEAST ONE DEFINED ELEMENT

431 — DEFINING THE TARGET STRUCTURES ITERATIVELY AND HIERARCHICALLY

435 — DEFINING TARGET STRUCTURES AT EACH CONSECUTIVE STEP AS REPETITIONS OF ELEMENTS AND STRUCTURES OF PREVIOUS STEPS

440 — VERIFYING THE TARGETS ACCORDING TO THE HIERARCHICAL TARGET DESIGN RULES

450 — GENERATING A METROLOGY TARGET DESIGN FILE FROM A GIVEN TARGET DESIGN

452 — IDENTIFYING AT LEAST ONE TARGET STRUCTURE ELEMENT IN THE GIVEN TARGET DESIGN

454 — EXPRESSING THE GIVEN TARGET DESIGN AS A HIERARCHICAL STRUCTURE WITH RESPECT TO THE IDENTIFIED TARGET STRUCTURE

Figure 4B

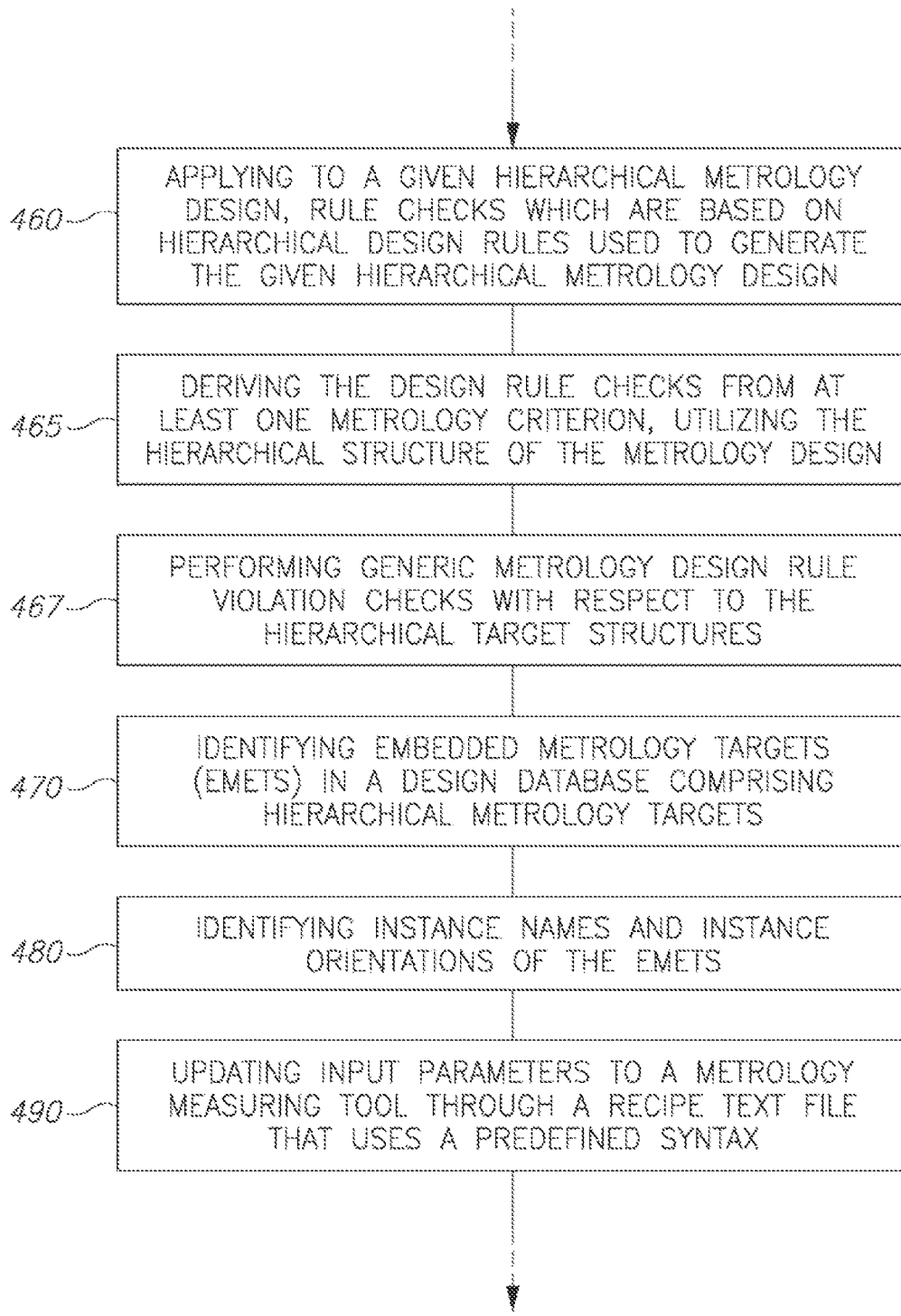
Figure 4B (cont. 1)

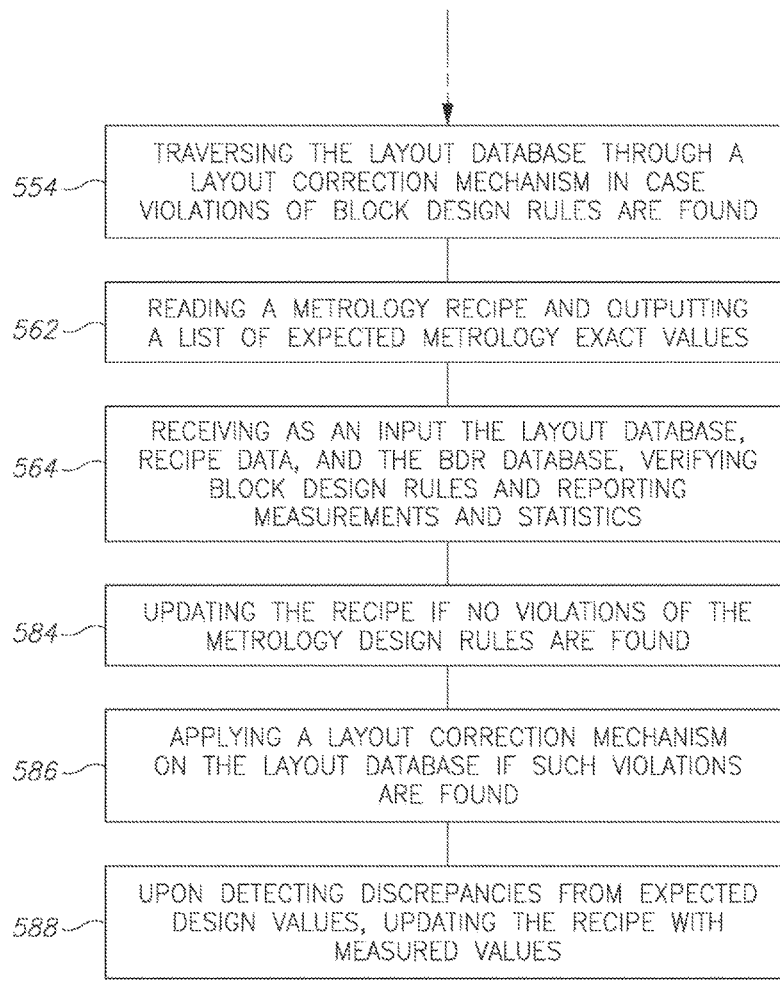
Figure 5G (cont. 1)

METROLOGY TARGET IDENTIFICATION, DESIGN AND VERIFICATION

CROSS-REFERENCE TO RELATED APPLICATIONS

This application is a Continuation of International Patent Application Serial No. PCT/US2014/20303, filed on Mar. 4, 2014, which application claims priority of United States Provisional Patent Application No. 61/772,513, filed on Mar. 4, 2013 and United States Provisional Patent Application No. 61/811,047, filed on Apr. 11, 2013, which applications are incorporated herein by reference.

FIELD OF THE INVENTION

The present invention relates to the field of metrology, and more particularly, to metrology target identification, design and verification.

BACKGROUND OF THE INVENTION

Conventional metrology methods are based on dedicated metrology structures or targets. In semiconductor manufacture and patterning processes in particular, process control is enabled by performing metrology on specific dedicated structures, either in the scribe lines between dies or within the die itself. Metrology methods face the challenges of reflecting the status of the actual device features accurately. The challenges are reflected in the ITRS 2011 guidelines under metrology difficult challenges—Measurement test structures and reference materials as following: "The area available for test structures is being reduced especially in the scribe lines. Measurements on test structures located in scribe lines may not correlate with in-die performance. Overlay and other test structures are sensitive to process variation, and test structure design must be improved to ensure correlation between measurements in the scribe line and on chip properties. Standards institutions need rapid access to state of the art development and manufacturing capability to fabricate relevant reference materials."

The following documents are incorporated herein by reference in their entirety. U.S. Pat. No. 7,925,486 teaches creating a metrology target structure design for a reticle layout by simulating how one or more initial metrology target structures will be formed on a wafer based on one or more fabrication processes that will be used to form a metrology target structure on the wafer and one or more initial metrology target structure designs. The method also includes creating the metrology target structure design based on results of the simulating step. U.S. Pat. No. 7,631,286 teaches automatic generation of a metrology recipe without referencing a wafer, for locating measurement locations corresponding to test features on the wafer and directing the metrology tool to the locations, by calculating coordinates for the measurement locations based on mask data, lithography tool data, CAD data and process data. The metrology recipe directs the metrology tool to within 10 microns of test features formed on the wafer. Criteria may be input to a data base to identify multiple existing recipes and the automatically generated recipe may be generated to replace each identified recipe. U.S. Patent Publication No. 2003/0229410 teaches a metrology tool to measure a parameter of a semiconductor device that includes a control element to select sites for measurement based on a pattern dependent model of a process with respect to the device. Problematic areas, within a chip or die and within a wafer, are identified as results from process variation. The variation is identified and characterized, and the location of each site is stored. The sites may be manually entered into a metrology tool or the method will automatically generate a measurement plan. Process variation and electrical impact are used to direct the measurement of within-die and wafer-level integrated circuit locations. U.S. Pat. No. 8,214,771 teaches scatterometry metrology target design optimization and is included herein by reference in its entirety.

Conventional metrology targets also must obey strict design rules in order to be compatible with specific metrology tool physical and software architecture. A known problem in the art is that despite the designer's intent, the complex process of design and insertion of metrology targets which themselves are becoming increasingly complex frequently results in design files which do not comply with design intent and in some cases even violate metrology design rules. These discrepancies arise due to the various processes the design files undergo subsequent to initial design and prior to final tape out for reticle manufacture. In many cases, layers are mislabeled, features rotated, offsets modified, features shrunk, features eliminated, features reproduced on the wrong design layer or lithographic polarity reversed, to mention just a few of the possible layout defects. Furthermore errors may also occur in the original design synthesis, such as incompatible pitches, duty cycles, and segmentation strategies. Furthermore, the set up parameters of the metrology tool such as acquisition coordinates, illumination and polarization are determined in the calibration phase with respect to the specific design values of each target where it is guided by the metrology recipe. Discrepancies from the design intent often result in a recipe that is inconsistent with design file thus encumber set up process and impact the quality of metrology measurements.

BRIEF SUMMARY OF THE INVENTION

One aspect of the present invention provides in-die metrology target identification, hierarchical metrology target designs and design verification procedures.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIG. 4B is a high level schematic flowchart of methods, according to some embodiments of the invention;

DETAILED DESCRIPTION OF THE INVENTION

Figure 1A:
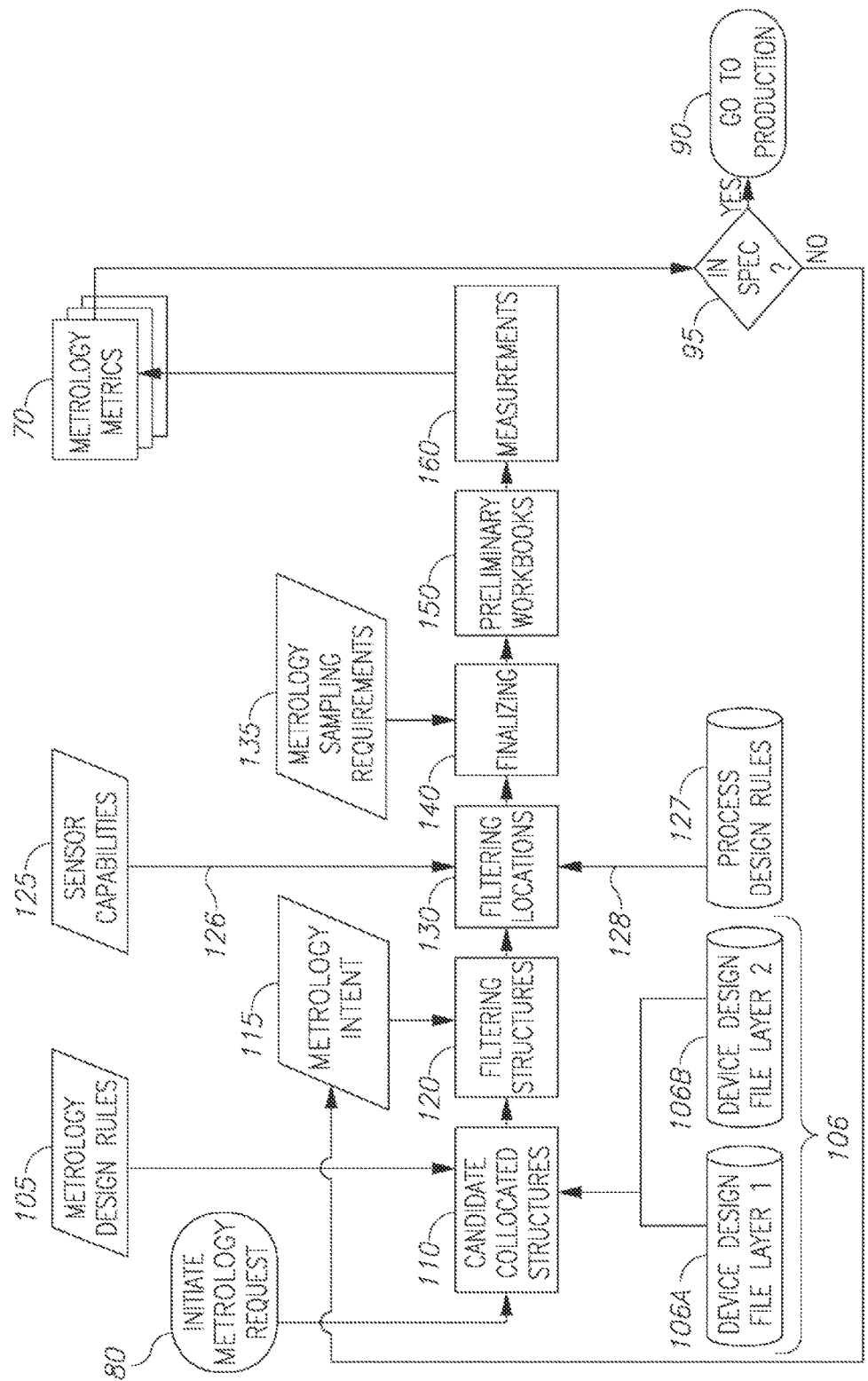
FIG. 1A is a high level schematic flowchart of an in-die metrology method, according to some embodiments of the invention.

Prior to the detailed description being set forth, it may be helpful to set forth definitions of certain terms that will be used hereinafter.

The term "GDS (Graphic Database System)" as used in this application refers to a generalized design format for describing an IC (Integrated Circuit) layout and is not limited to any specific design format, i.e., "GDS" may refer to any of current or future design formats, e.g., GDSII, Open Access formats, Oasis, Frame, Jobdeck or any combination of these formats.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

A metrology design and verification framework is provided, which includes methods and systems for metrology structure identification in an integrated circuit design data block, design rule checking, hierarchal design of metrology target structures to minimize random errors, and metrology design rule verification of metrology target design files. In-die metrology targets are identified using various filtering methods and/or designed as hierarchical structures within dies or outside the dies. Particularly, metrology target design files are generated, which are hierarchical in structure and compatible with design rule checks. Design rule check takes into account the hierarchical and often repetitive target designs in the verification process. Layouts may be verified using design rule checks at different levels of design rules, which may be combined to remove rule violations and errors prior to actual target production.

The methods and systems disclosed below identify metrology targets, construct or generate metrology targets, and verify metrology targets using different schemes and scenarios. While certain embodiments presented below are explained and illustrated separately from other embodiments, it is emphasized that the invention comprises combinations of embodiments and of features which are disclosed below, even when these are illustrated in different figures or referred to separately in the text. Particularly, the various verification stages may relate to design stages, and may be used as structure identification stages, and vice versa. Specific verification procedures may be configured according to target selection or construction stages and so forth.

Before specific examples are illustrated in detail, the following approaches are presented as outlines for the scope if the invention. These approaches are interdependent and components of them may be combined and configured to fit specific processes and procedures, as exemplified in the illustrations.

Methods and systems of the invention comprise identifying locations in an integrated circuit design file which meet specific criteria and hence enable metrology to be performed directly on the device structure during semiconductor manufacture. Furthermore, a search engine may be used, which takes at least one design file (and two or more design files if they are overlaid) and performs the location search. Two dimensional design data from a design file at locations which meet a predetermined set of criteria may be combined from one or more layers of a device with process information in order to enable prediction of metrology performance at said location. Metrology may thus be enabled on the device structure at predetermined locations on existing features by generating a metrology recipe which has been optimized by simulation of the metrology performance over a space of metrology configurations.

Methods and systems of the invention comprise searching design files of semiconductor devices or integrated circuits using EDA (Electronic Design Automation) tools to identify locations or metrology sites where metrology may be performed without the necessity of insertion of dedicated metrology structures. Semiconductor metrology may include, but is not limited to overlay, critical dimensions, sidewall angle, lithography focus and dose, film stack thickness or composition characteristics. Furthermore, EDA tools may be used in order to automate the design, insertion and checking of dedicated metrology targets. In certain embodiments, the methods and systems comprise identification of a metrology compatible design structure by searching a pattern database for patterns which comply with specific metrology design rules such as pitch, duty cycle, orientation etc. Once a small subset of patterns from the database have been specified, these patterns may be rapidly located in a specific integrated circuit design file. For example, locations may be identified where the patterns are either proximate or co-located on one or more layers. A particular pattern may be selected on the basis of its spatial availability distribution in a design file. Alternately or complementarily, once such patterns have been identified, they may be used as building blocks to design process compatible scribeline or in-die metrology targets which may be dropped into the design.

Methods and systems of the invention comprise on-device (on-die) metrology methods that overcome the challenges to take such measurements in face of the lack of sensitivity in optical metrology or in face of the required modeling complexity leading to a multi-parameter inverse problem that involves multiple parameter correlations. Several methods are proposed in this invention to identify locations with enhanced sensitivity or reduced modeling complexity, to overcome sensitivity and correlation challenges (in model-based metrology) that lead to poor accuracy and/or poor precision in the parameters of interest when measured on device structures.

Methods and systems of the invention comprise building a design flow and handling guidelines supported by verification metrics, which reduces the probability of random or systematic error in the process steps in between the structure design and mask shop. Additionally, disclosed methods and systems verify that semiconductor metrology target design files (i) comply with designer intent and/or (ii) are free of design defects and comply with metrology design rules prior to tape out and subsequent semiconductor manufacture and/or (iii) comply with block metrology design rules. Additionally, a method for metrology recipe update using layout verification feedback is disclosed.

Methods and systems of the invention comprise building a software tool to get as input an IC layout design in a form of any design format (such as GDSII, Oasis, Frame Jobdeck or any combination of these formats; as GDS is an industry standard to describe IC layout, the present disclosure uses it as generic, non-limiting term) in which there are Embedded Metrology Targets (EMET). The software tool is configured to output an update for the metrology measuring tool as of their location and orientation.

Semiconductor metrology methods and systems of the invention comprise measuring different parameters of metrology targets such as, but not limited to, overlay, critical dimensions, sidewall angle, lithography focus and dose, film stack thickness or composition characteristics. Methods may involve using Electronic Design Automation (EDA) tools in order to automate the design, insertion and checking of dedicated metrology targets. Methods may be applied to targets and wafers produced by any patterning process, including double and triple patterning lithography (DPL, TPL respectively), multiple patterning lithography as well as extreme ultraviolet lithography (EUVL).

Figure 1B:
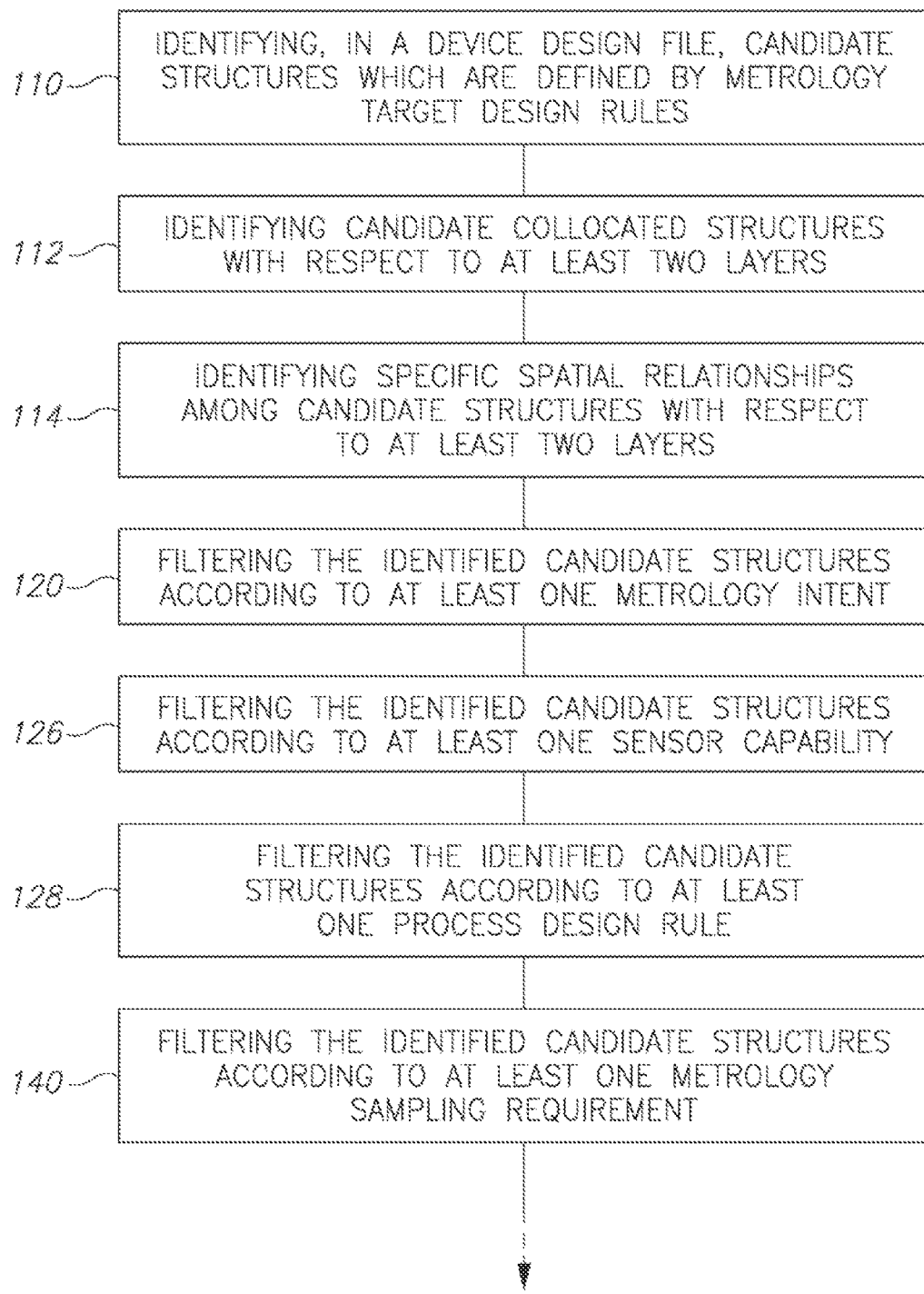
FIG. 1B is a high level schematic flowchart of an in-die metrology method, according to some embodiments of the invention.
Figure 1C:
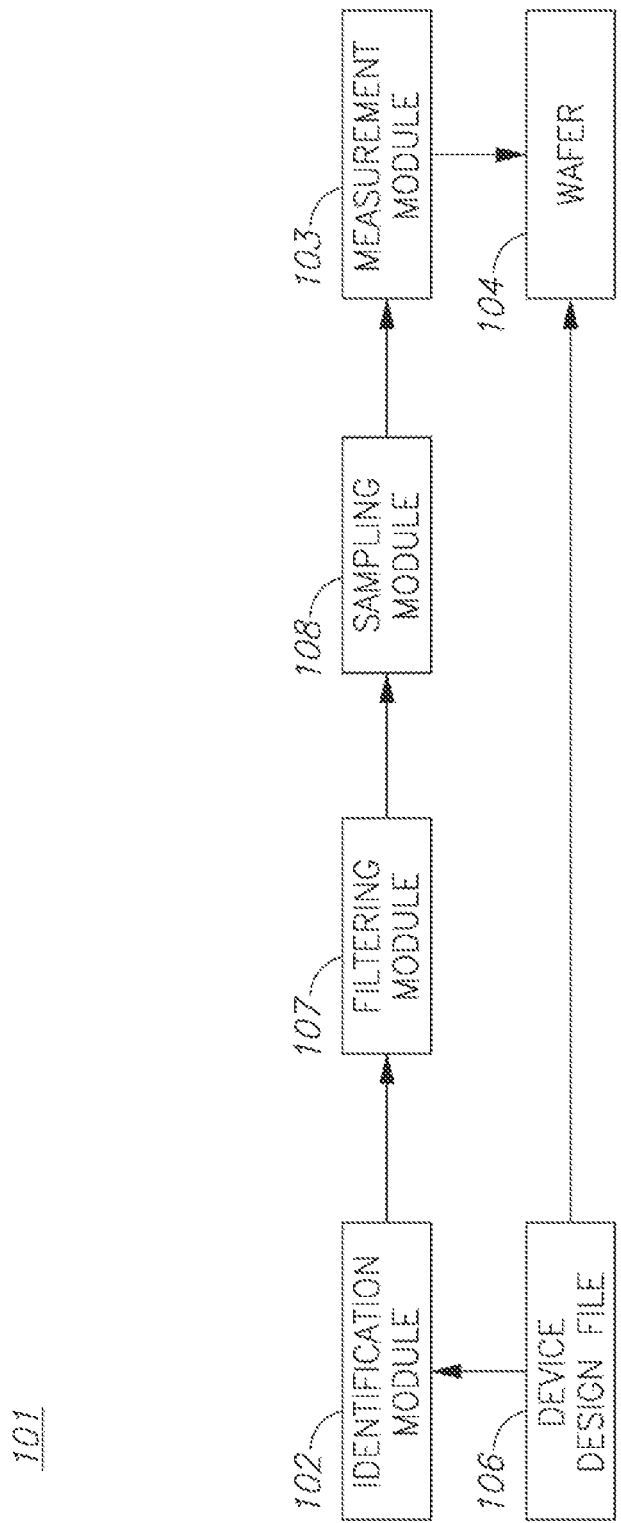
FIG. 1C is a high level schematic block diagram of an in-die metrology system, according to some embodiments of the invention.

FIGS. 1A and 1B are high level schematic flowcharts of an in-die metrology method 100, according to some embodiments of the invention. FIG. 1C is a high level schematic block diagram of an in-die metrology system 101, according to some embodiments of the invention.

In-die metrology method 100 comprises (FIG. 1B) identifying, in a device design file, candidate structures which are defined by metrology target design rules (stage 110) and measuring the identified candidate structures in-die on wafers produced according to the device design file (stage 160). Any of the disclosed stages may be carried out by at least one computer processor. A computer program product is disclosed, comprising a computer readable storage medium having computer readable program embodied therewith, the computer readable program configured to carry out any of the stages of in-die metrology method 100. Accordingly, some of the method stages are illustrated as modules in FIG. 1A. Metrology targets comprising the candidate structures identified in method 100, as well as metrology design files configured to define production of such metrology targets are likewise part of the current disclosure.

In-die metrology method 100 may further comprise any of the following stages: filtering the identified candidate structures according to at least one metrology intent (stage 120), filtering the identified candidate structures according to at least one sensor capability (stage 126), filtering the identified candidate structures according to at least one process design rule (stage 128) and filtering the identified candidate structures according to at least one metrology sampling requirement (stage 140).

Process design rules 127 (used for filtering 128) may comprise any of the feature symmetry, feature size and one or two dimensional periodicity or offset between centers of symmetry of features. Device design file 106 (used for identifying candidate structures 110) may comprise at least two layers 106A, 106B and identifying 110 may comprise identifying candidate collocated structures with respect to at least two layers 106A, 106B (stage 112). In certain embodiments, identifying 110 may comprise identifying specific spatial relationships among candidate structures with respect to at least two layers 106A, 106B (stage 114).

Method 100 may further comprise selecting candidate structures for a Depth of Focus (DoF) scanner sampling strategy (stage 170).

FIG. 1A describes embodiments for metrology structure identification. A schematic, illustrative and non-limiting timeline is indicated in days for most stages. In a first step 110 search criteria are defined in a set of metrology design rules (MDR) 105. Examples for search criteria comprise feature symmetry, size, one or two dimensional periodicity or offset between centers of symmetry of features. Such design rules 105 are then used to search a design file such as GDS (Graphic Database System) design file 106 for identifying locations which meet the MDR. For example, in overlay metrology location identification, the two dimensional design data from two different patterning layers 106A, 106B may be overlaid to identify locations which meet specific criteria simultaneously on both layers 106A, 106B. In one example, features on both layers 106A, 106B may have identical pitches within a certain range of spatial frequencies and the overlapping area on each layer may be greater than a threshold. Additional design rules may specify the relationship between features in two or more layers. For example, a specific spatial relationship such as an offset between the centers of symmetry of the features in the two layers 106A, 106B may be required to be within certain bounds. Any other metrology design rule may be used in method 100.

In a second step, a second location filter 120 may be applied to the location set from first step 110 which includes metrology intent information 115. By way of example, metrology intent 115 may specify a functionality of the IC (Integrated Circuit) location such as a memory cell or the metrology intent 115 may specify a device architecture such as a finFET. The metrology intent 115 may also specifically identify the definition of the quantity to be measured in terms of the features' geometric characteristics, for instance overlay is defined as offset between center of symmetry of bottom of photoresist and center of symmetry of top of polysilicon etch trench. The metrology intent 115 may also be defined in the negative for example by excluding certain design areas from the metrology process due to risk of metrology radiation exposure induced structural or functional modification.

In a third step, an additional location filter 130 which combines two new data types may be applied to the location set output from second location filter 120. This third step inputs Process Design Rules (PDR) 127 which are typically part of a design database for a specific product or design node. A known industry example of such a design database containing process design rules is TSMC's DFM Data Kit (DDK). This database includes topography and process stack (Z information). In location filter step 130, Process Design Rules 127 are combined with specific metrology sensor capabilities 125 such as angles of incidence, spectral range, illumination intensity, phase measurement capabilities, noise models, etc. When these two data types are taken in combination, basic metrology performance can be predicted since a three dimensional representation of the metrology location is now enabled. By way of example, if the metrology is an image based method, contrast may be predicted and compared with a threshold. If the metrology is, for example, scatterometry based, sensitivity (precision) and parameter correlation may be estimated and locations selected which reduce model complexity or enable model-free metrology.

In a forth step, metrology sampling requirements 135 are introduced in order to finalize the selection of the sites 140. Examples for metrology sampling requirements 135 are scanner control degrees of freedom, product disposition specifications and exposure tool degrees of freedom which specify the spatially dependent terms of the exposure tool control model. These can be in exposure field coordinates or wafer level coordinates or a combination of both. The exposure tool degrees may be used to dictate the sampling requirements 135 and the metrology site selection may be finalized 140. In certain embodiments, sampling may be carried out with respect to the target's position on the wafer, e.g., targets may be selected in the wafer center or at wafer edges, depending on expected or detected overlay-induced defects.

In a fifth step, preliminary metrology workbooks and recipes may be generated 150. The preliminary metrology workbooks and recipes may contain a combination of any of the following, e.g. metrology location information an initial seed for model based metrology, metrology tool setup such as illumination intensity, polarization, angles of incidence and aperture characteristics.

In a last step, metrology may be performed on test or product wafers 160 manufactured according to the design data utilized in the previous steps and metrology metrics 70 may be obtained. Examples of metrology metrics 70 are static or dynamic precision, tool induced shift, tool induced shift variation across the wafer, matching between results from the same site with different metrology tool setup, matching between metrology results from the same site between different metrology tool type, e.g. optical vs. SEM, sensitivity to variation of parameter to be measured, correlation between metrology parameters, linearity in response to programmed parameter variations. Finally, if the designated metrology metrics are outside a nominal specification (stage 95), the process may be reiterated. Otherwise, the targets may proceed to production 90.

It is appreciated that although the embodiments described above have been described as a sequence in a particular order, alternative orders of the location filter sequence are also possible. For example, it may be advantageous to perform metrology intent filter step 120 subsequent instead of prior to PDR filter step 130. Certain embodiments may comprise different permutations of the disclosed stages, and specific steps in the location identification sequence may be omitted, such as the recipe generation step 150.

Embodiments of the invention comprise an in-die metrology system 101 (FIG. 1C) comprising an identification module 102 arranged to identify, in device design file 106, candidate structures which are defined by metrology target design rules; and a measurement module 103 arranged to measure the identified candidate structures in-die on wafers 104 produced according to device design file 106. In-die metrology system 101 may further comprise a filtering module 107 arranged to filter the identified candidate structures according to at least one metrology intent, at least one sensor capability, at least one process design rule and/or at least one metrology sampling requirement. The disclosed systems, methods and steps thereof may be implemented partially or fully in software executed by at least one computer processor. In-die metrology system 101 may be at least partly implemented in computer hardware.

In-die metrology method 100 and system 101 may be used for overlay metrology as well as for critical dimension (CD) measurements. In the latter case, method 100 may further comprise selecting candidate structures for a Depth of Focus (DoF) scanner sampling strategy (stage 170). In particular, the candidate structures may be defined, filtered and selected to allow an effective sampling strategy with regard to the structure distribution over the wafer 104 (or over one or more device). Structure selection with respect to DoF scanner requirements may be part of the filtering rules. System 101 may comprise a corresponding sampling module 108 configured to carry out stage 170.

Advantageously, embodiments of the disclosed methods overcome the shortcomings of current metrology methods. Firstly, the disclosed methods enhance the ability of metrology data to accurately reflect the status of the actual device features in the die, as embodiments of the disclosed invention are not limited by discrepancies between dedicated metrology targets and actual device features. In the prior art these discrepancies arise due to differences in process loading, pattern density or aberration fields because metrology targets and the device features are not at the same location. The in-die metrology targets overcome and remove these discrepancies, as the targets are much more similar to actual device features and may even comprise device features. Furthermore, the disclosed metrology structures have similar characteristic feature sizes to those of the device and thus overcome many of the sources or error, arising from conventional targets being much larger than device features (even close proximity of current targets and device features does not fully compensates for the differences in size). Finally, disclosed designs dispense with the requirement of additional place in the device layout for metrology structures, which, when sampling density requirements are high, may compete for space with functional device features. The current invention overcomes these challenges by enabling metrology directly in the device.

Advantageously, embodiments of the disclosed methods may be used to measure multilayer structural parameters of targets and structures and not merely topographical features of devices which are available to Scanning Electron Microscope (SEM) methods. Furthermore, both the multilayer structural parameters and the filtering approach enable a high level of control over the selection and filtering steps that allows considering the spatial distribution of candidate structures and targets over the entire wafer 104 or group of devices. Additionally, embodiments of the disclosed methods allow combining identification of fine structural and process details with maintaining over view considerations regarding the wafer 104.

Figure 2A:
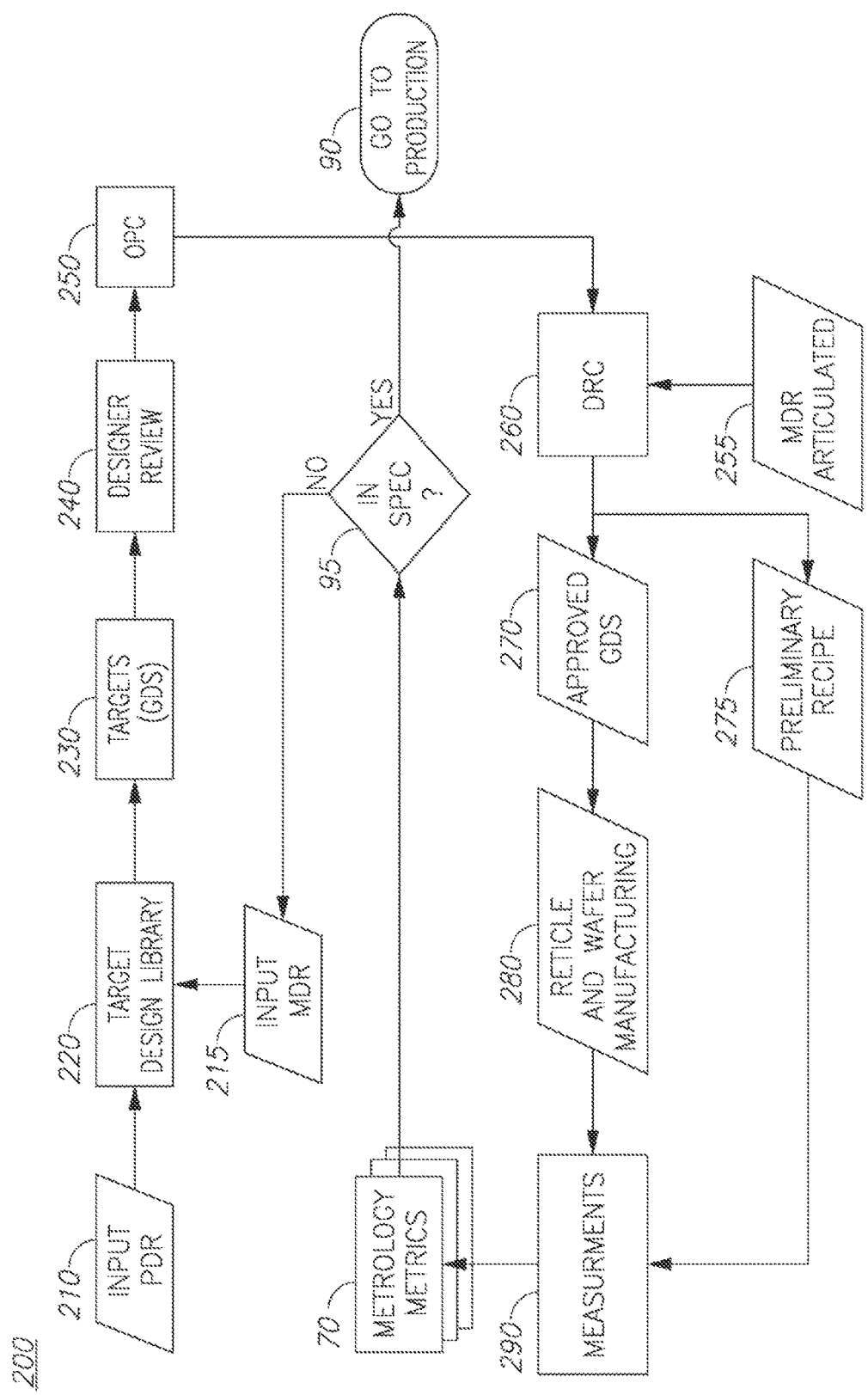
FIG. 2A is a high level schematic flowchart of a method, according to some embodiments of the invention.
Figure 2B:
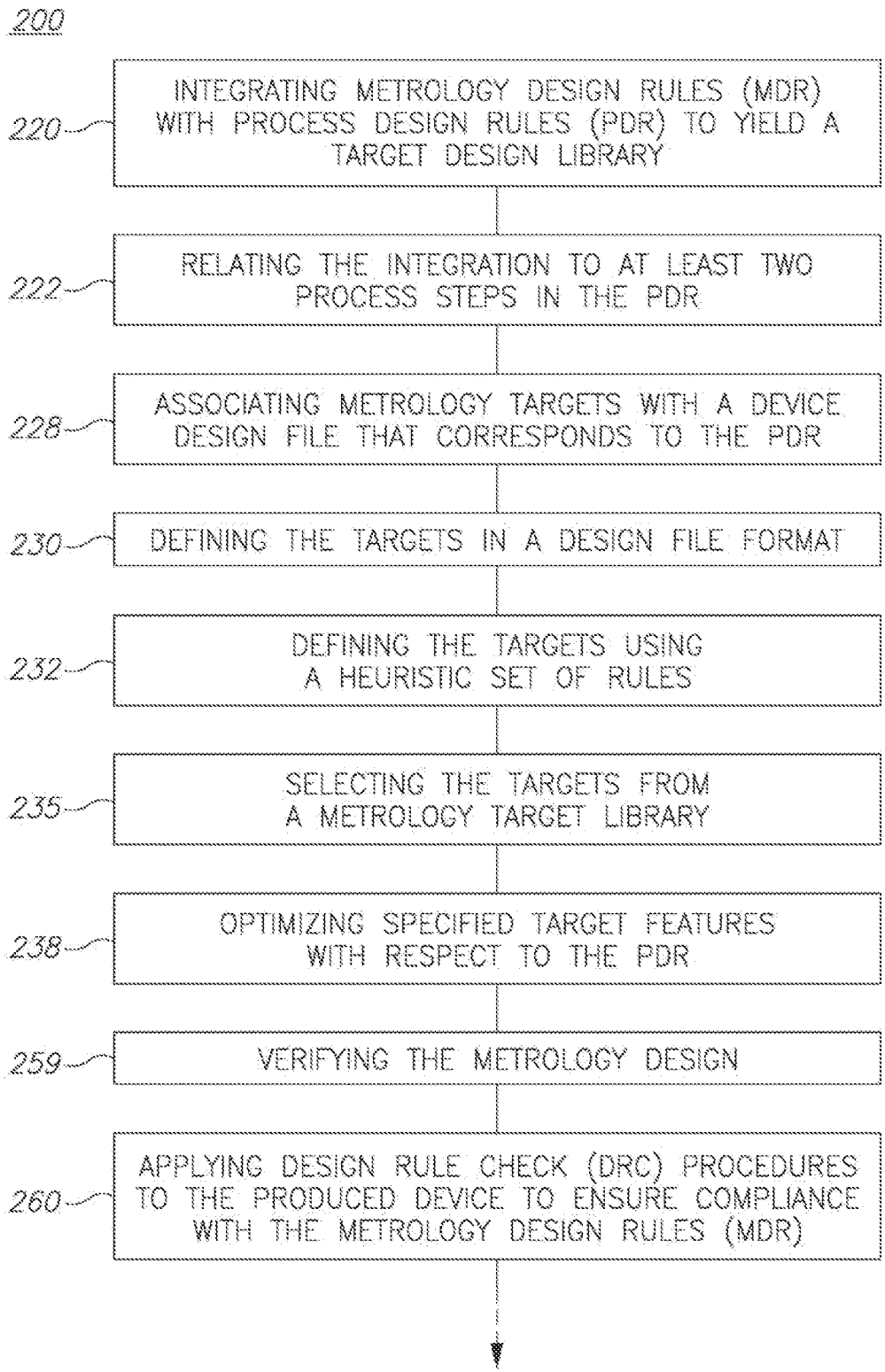
FIG. 2B is a high level schematic flowchart of a method, according to some embodiments of the invention.

FIGS. 2A and 2B are high level schematic flowcharts of a method 200, according to some embodiments of the invention.

Method 200 (FIG. 2B) may comprise integrating Metrology Design Rules (MDR) with Process Design Rules (PDR) to yield a target design library (stage 220) comprising a plurality of metrology targets associated with a device design file that corresponds to the PDR, wherein the integrating relates to at least two process steps in the PDR. Method 200 may comprise associating metrology targets with a device design file that corresponds to the PDR (stage 228) and relating integration 220 to at least two process steps in the PDR (stage 222).

The targets may be defined in a design file format (stage 230) and/or using a heuristic set of rules (stage 232) and/or be selected from a metrology target library (stage 235), possibly using stages disclosed above in relation to in-die metrology method 100. Method 200 may further comprise determining the metrology targets using at least one of: a heuristic set of rules, a metrology target library and a combination thereof. Method 200 may further comprise optimizing specified target features with respect to the PDR (stage 238). Method 200 may further comprise applying Design Rule Check (DRC) procedures to the produced device to ensure compliance with the Metrology Design Rules (MDR) (stage 260), for example, as described below.

Any of the disclosed stages may be carried out by at least one computer processor. A computer program product is disclosed, comprising a computer readable storage medium having computer readable program embodied therewith, the computer readable program configured to carry out any of the stages of method 200. Accordingly, some of the method stages are illustrated as modules in FIG. 2A. Target design libraries defined by method 200 are likewise part of the current disclosure.

In certain embodiments, method 200 may use similar information as used by method 100 to enable improved metrology accuracy, sensitivity or layout fidelity on dedicated metrology targets in the scribeline or within the device area of the die. This is achieved by metrology target design optimization through the use of EDA (Electronic Design Automation) tools. As device design complexity increases, process compatibility of the metrology structure may become an enabler for achieving accurate metrology. Utilizing EDA information in the process of metrology target design may reduce the risk of metrology target design failures which may be related to any of sensitivity, accuracy or layout. "Sensitivity failure" refers to the sensitivity of the measured signal to variations in the parameter to be measured, compared with either the noise floor of the signal or the sensitivity to other parameters which are correlated to the measured signal. "Accuracy failure" refers to any systematic discrepancy between the metrology result and the "actual value" of the parameter as it was intended by the metrologist. An example of such an accuracy failure is a bias beyond some nominal threshold between the metrology result on the metrology target and that determined on the device feature itself, either by the same metrology sensor or an entirely different one such as a SEM. "Layout failure" refers to a case in which the actual geometric layout of the target in the design file (typically, but not limited to, GDS data) is different from that intended by the metrologist. An example of such a layout error in the case of overlay metrology is that the centers of symmetry of the two features which are nominally collocated for the case of zero overlay are actually offset relative to one another by an amount greater than a specified tolerance.

FIG. 2A describes embodiments of metrology target design optimization sequences. A schematic, illustrative and non-limiting timeline is indicated in days for most stages. In a first step of the design sequence, process design rules for a given node or product and metrology design rules for a particular metrology tool are inputted 210 into an automated design module which generates a target design library 220 using inputted MDR for a given metrology tool 215. Design module 220 may use a heuristic set of rules to generate metrology targets or may access a metrology target library for a match to the required design criteria, or a combination of the two. Specific target design parameters such as exclusion zones between target elements or target pitch may also be optimized by model or simulation based methods. The present invention overcomes limitations of prior art such as U.S. Pat. No. 7,925,486, among others by integrating and referring to the whole process by using the process design rules (PDR) and not referring merely to the lithographic step. The design sequence may result in a target design file on several layers of the integrated circuit design since it may include the layers to be measured and also additional layers, i.e. the dummy structures introduced above below or between the layers to be measured in order to ensure process robustness and compatibility. Method 200 thus may incorporate and integrate various process steps such as etching and deposition and is in particular not limited to the actual lithography step. Advantageously, method 200 utilizes crucial information that is derivable or derivable solely from these types of steps. Method 200 may integrate structural details from the entirety of the design process to design and/or identify and/or select metrology targets.

In a second step the target design is converted into design format such as GDS 230 and may optionally be reviewed by the designer 240. After integration into the reticle design layout (not shown) OPC (Optical Proximity Correction) is typically applied 250, although this is optional. Subsequent to OPC a design rule check (DRC) 260 is applied and performed on the OPC decorated target design file. DRC 260 is described in more detail below. In certain embodiments, DRC 260 may be applied before or after OPC 250. After DRC step 260 the GDS is approved 270 for tape-out and released for reticle and subsequent wafer manufacture 280. Preliminary workbooks and/or metrology recipes may also be generated at this point 275. The wafers are then measured on the metrology tool 290 and the metrology performance is estimated based on metrology metrics 70, as described in FIG. 1A.

Method 200 may comprise verifying the metrology design 259 by DRC 260, comprising applying, to a given metrology design, a plurality of design rule checks which are based on design rules used to generate the given metrology design, wherein the design rule checks are derived from at least one metrology criterion (stage 262). The metrology criteria may comprise for example (i) sizes of metrology structures and distances between metrology structures in the given metrology design; (ii) pitches of periodic features in the given metrology design with respect to specified measurement requirements, for example, the given metrology design may be a scatterometry design and the specified measurement requirements may be that the given metrology design generates a zero order diffraction and/or a plus and minus first order diffraction. Verification method 259 (e.g., by DRC 260) may further comprise configuring the design rule checks to be applied to: (i) optical proximity correction (OPC)—decorated metrology designs (stage 264); (ii) lithography-simulated metrology designs (e.g. by aerial imaging) (stage 266); and (iii) scatterometry results of the given metrology design (stage 266).

In certain embodiments, design rule checking (DRC) used in electronic design automation to verify manufacturability of the devices may be modified to be used to verify the design of metrology targets. Alternatively or complementarily, design rule checker module 260 for metrology targets is provided. Design rule checker module 260 may be used in order to validate that the design of the metrology target either pre or post OPC decoration enables accurate metrology when the metrology target on the manufactured wafer eventually reaches the metrology tool. The inventors have found out that such use of design rule checker module 260 is novel and advantageous and that design rule checker module 260 indeed may be adapted and arranged to achieve this new aim. DRC tool 260 is provided with the locations of the metrology targets (either scribeline or in-die) and the targets are checked for various criteria.

Many criteria may be envisaged for checking the metrology structure. For example, the size of the metrology structure and the distance to other proximate structures could be checked to verify that a metrology signal from a given metrology tool with a given spot size will not be contaminated by radiation scattered from features other than the metrology target. A second example is to verify that the pitch of the periodic features of the metrology target is such that the metrology collects appropriate diffraction orders. A particular example is the case of scatterometry whereby only zero order diffraction is allowed to enter the optical aperture, or that both plus and minus first order diffraction is allowed to enter the optical aperture of the metrology sensor. A third example is to verify that relative feature placements meet specific criteria. For instance, in the case of overlay metrology, the design rule checker needs to verify the exact relative position of the metrology features in two or more design levels (mask designs). The centers of symmetry may need to be coincident or possibly offset by a very specific amount. In scatterometry overlay targets the metrology tool algorithm assumes very specific offsets between different features or cells (of which there may be a number per layer with different offsets) on two or more layers in order to be able to accurately measure overlay.

In certain embodiments, design rule checking 260 may be carried out on the pre OPC decorated file to verify designer intent. In another version of the design rule checker, the checking is done on the post OPC decorated file to verify that the metrology target has not been adversely modified by the OPC process 250. In a third version, an aerial image simulation of the metrology target is performed using the post OPC decorated design file in order to predict the photoresist shape of the target on the wafer.

A full lithography simulation may also be used. For example, the method may use a wafer simulation model, or "lithography process model", to predict how the one or more initial metrology target structure designs will appear when printed at the wafer level. The wafer simulation model may include parameters that account for variations in the lithography process as well as a resist and/or one or more additional layers formed on the wafer. The one or more parameters of the model may include, for example, the resist thickness, the composition of the resist, one or more characteristics (e.g., thickness and composition) of layers formed on the wafer under and/or on top of the resist, the wavelength of the exposure, the numerical aperture (NA) of the exposure tool, the coherence of the exposure tool, dose of the exposure, focus of the exposure, etc.

A user may also set up a lithography or photolithography simulator so that the simulator represents the process layer for which the metrology target structure is being designed. For example, the user may select values for one or more parameters of a model describing the lithography or photolithography process. The parameter(s) of the model may include any of the parameters described herein. The results of the simulating step may include images illustrating how the one or more initial metrology target structures will be formed on the wafer or any other output that is indicative of how the one or more initial metrology target structures will be formed on the wafer. Furthermore, simulation tools may be used to predict results of other fabrication stages, such as etching and deposition.

Embodiments of the invention comprise metrology design rule checker module 260 arranged to apply, to a given metrology design, a plurality of design rule checks which are based on design rules used to generate the given metrology design, wherein the design rule checks are derived from at least one metrology criterion. Metrology design rule checker module 260 may implement various aspects of metrology verification method 259 any all embodiments described above are applicable to both. The disclosed methods and stages thereof may be implemented partially or fully in software executed by at least one computer processor. Metrology design rule checker module 260 may be at least partly implemented in computer hardware. Any of the disclosed stages of verification method 259 may be carried out by at least one computer processor. A computer program product is disclosed, comprising a computer readable storage medium having computer readable program embodied therewith, the computer readable program configured to carry out any of the stages of verification method 259, as are metrology designs which are checked and/or corrected by metrology verification method 259.

Figure 3A:
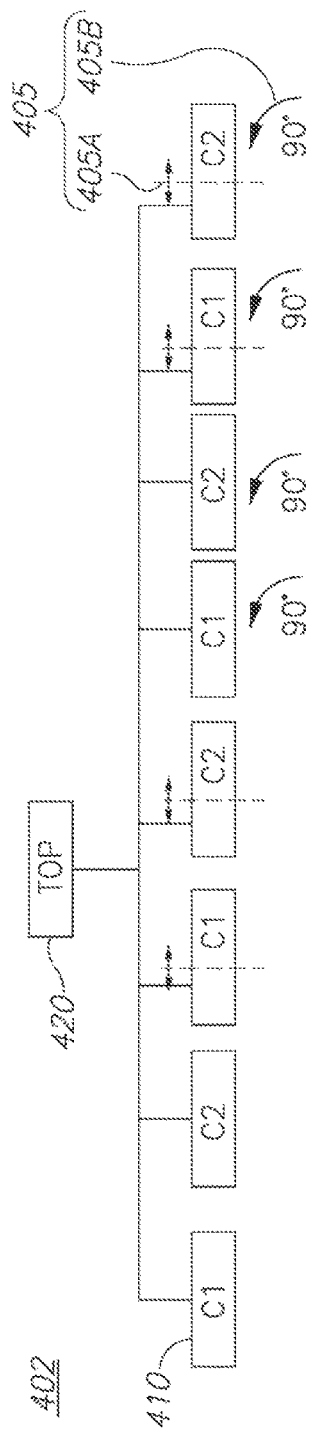
FIG. 3A exemplifies a simplified hierarchically structured metrology target design file for metrology target, according to some embodiments of the invention.
Figure 3B:
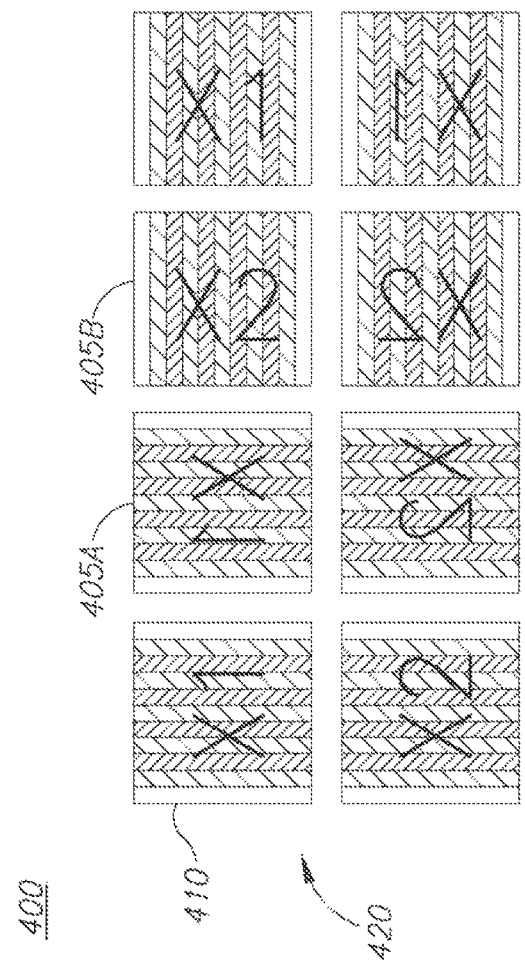
FIG. 3B schematically illustrates eight cell SCOL targets, according to some embodiments of the invention.
Figures 3C, 3D:
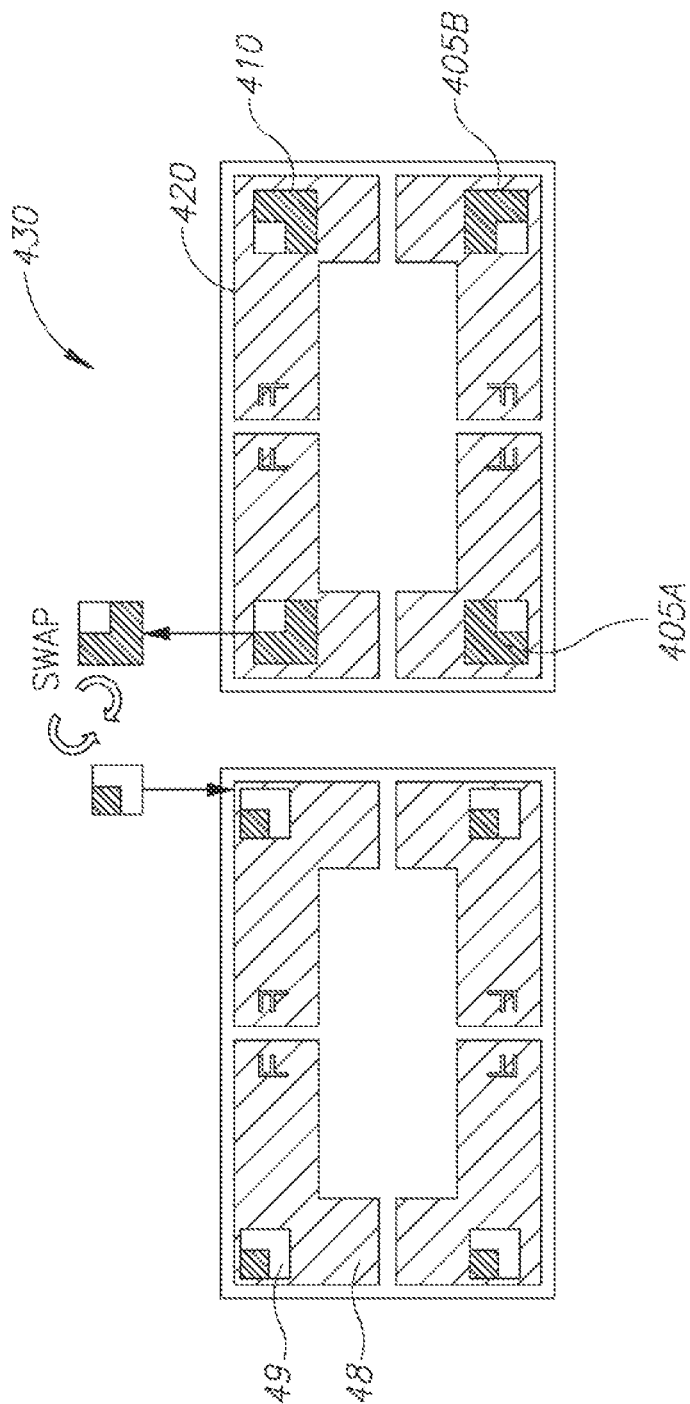
FIG. 3C schematically illustrates Embedded Metrology Targets (EMET) according to the prior art.
FIG. 3D schematically illustrates Embedded Metrology Targets (EMET) according to some embodiments of the invention.
Figure 4A:
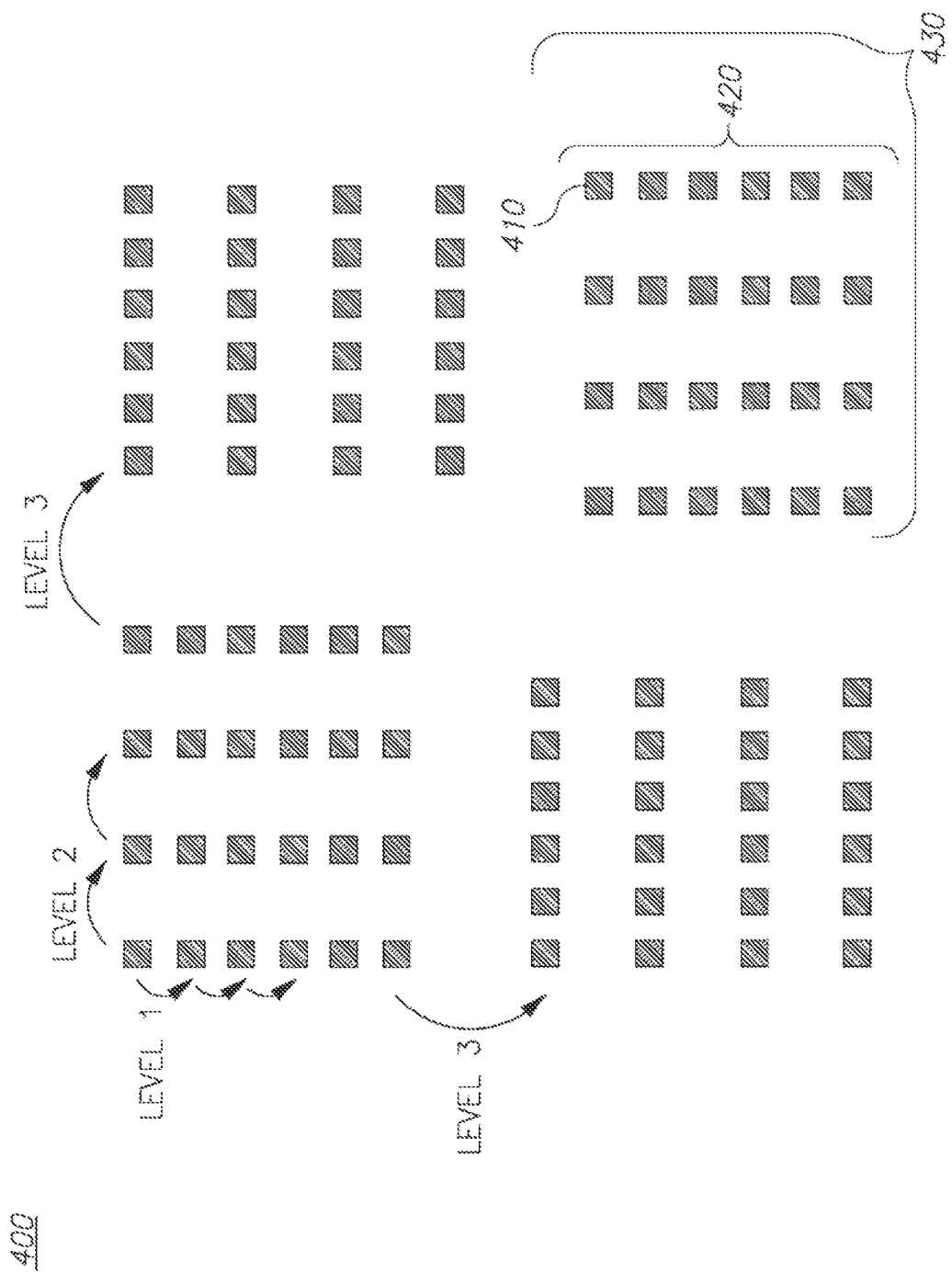
FIG. 4A schematically illustrates hierarchically designed metrology targets, according to some embodiments of the invention.

FIGS. 3A, 3B, 3D, 4A and 4B are high level schematic illustrations of hierarchical metrology targets 400 and respective methods 401 and design files 402, according to some embodiments of the invention. FIG. 3A exemplifies a simplified hierarchically structured metrology target design file 402 for metrology target 400, according to some embodiments of the invention. FIG. 3B schematically illustrates such eight cell SCOL target 400, according to some embodiments of the invention. FIG. 3D schematically illustrates Embedded Metrology Targets (EMET) 410, according to some embodiments of the invention, compared with prior art EMETs illustrated in FIG. 3C. FIG. 4A schematically illustrates hierarchically designed metrology target 400 exhibiting three design levels 1-3, according to some embodiments of the invention. FIG. 4B is a high level schematic flowchart of a method 401, according to some embodiments of the invention.

Methods and systems of the invention comprise metrology target design files 402 which are hierarchical in structure and compatible with DRC rules, as presented above. Metrology target design files 402 (representing metrology targets 400) may comprise at least one target structure element and metrology target structures which are defined using repetitions of the at least one target structure element (see, e.g., FIG. 4A). Certain embodiments comprise metrology targets 400 produced according to metrology target design files 402. Embodiments of the invention comprise methods 401 of designing metrology targets (see, e.g., FIG. 4B), the method comprises defining at least one target structure element (stage 411) and defining target structures using repetitions of the at least one defined element (stage 421). Defining the target structures may be carried out iteratively and hierarchically (stage 431). For example, defining the target structures may be carried out at least twice, wherein the target structures at each consecutive step are defined as repetitions of elements and structures of previous steps (stage 435). The metrology target design files may further comprise at least one DRC assisting feature associated with at least one target element or target structure. The at least one DRC assisting feature may comprise a text label, an encapsulation, a hierarchy, and/or an auxiliary marker layer. Certain embodiments comprise a target verification method operating according to hierarchical target design rules implemented by the method described above. The target verification method may be implemented as at least part of DRC 260.

Certain embodiments comprise a metrology target design module arranged to generate a metrology target design file from a given target design by identifying at least one target structure element in the given target design and expressing the given target design as a hierarchical structure with respect to the at least one target structure. Certain embodiments comprise metrology design rule checker module 260 arranged to apply, to a given hierarchical metrology design, a plurality of design rule checks which are based on hierarchical design rules used to generate the given hierarchical metrology design, wherein the design rule checks are derived from at least one metrology criterion and utilize the hierarchical structure of the metrology design. The hierarchical metrology design may comprise at least one target structure element and metrology target structures which are defined using repetitions of the at least one target structure element, and wherein the at least one metrology criterion relates to at least one of: a hierarchical level of the structure, global target parameters, offsets between target layers, spacing between target elements or structures, overlaps between target elements or structures, orientation of target elements or structures, sizes of target elements or structures and respective metrology recipes. The metrology design rule checker module 260 may be further arranged to perform generic metrology design rule violation checks with respect to the hierarchical target structures.

FIG. 3A exemplifies a simplified hierarchically structured metrology target design file 402 for metrology target 400, according to some embodiments of the invention. FIG. 3A exemplifies design file structure, according to some embodiments of the invention, in which "Top" 420 represents a target cell name, in the example a SCOL8 (8 cell scatterometry overlay target) target cell name and "C1" and "C2" 410 represent grating cells with different specific geometries. Metrology target design file 402 may be synthesized in a fashion which is utilizing design hierarchy to represent the design symmetry. In the illustrated example, eight-cell target 400 is composed only of two cell designs, each repeated in four instances, with possible modifications 405 such as reflection 405A and rotation 405B. Any combination of modifications 405 may be selected to reach hierarchically designed target 400. Clearly, cells C1 and C2 410 may also be hierarchical in structure and/or top cell 420 itself may be part of a higher target hierarchy.

FIG. 3B schematically illustrates such eight cell SCOL target 400, according to some embodiments of the invention, having two types of cells 410 marked by "X1" and "X2" (corresponding to "C1" and "C2" respectively) which are used to generate all eight cells of target 400 (as a higher level structure 420) under application of reflections 405A and rotations 405B (the reflections and rotations of the "X1" and "X2" symbols denote respective reflection and rotations of the cell grating patterns). For example, x-direction cells 410 which are rotated in 90° may be used as y-direction cells.

In an analogous manner, FIG. 3D schematically illustrates Embedded Metrology Targets (EMET) 410, according to some embodiments of the invention. Prior art EMET designs (FIG. 3C) comprise embedded metrology targets 49 which are inserted at a fixed orientation with respect with elements 48 which are reflections and/or rotations of each other. Such designs cause metrology errors which result from the different relationship among targets 49 with respect to the relationship among elements 48. In contrast, embodiments of the present invention introduce EMETs which are reflected 405A and rotated 405B in a similar manner to elements 48, which may now be seen as elements 420 in the hierarchy of the whole structure 430, as disclosed herein. Swapping EMETs 410 for EMETs 49 provides more accurate metrology results and simplify target design and verification.

FIG. 4A schematically illustrates hierarchically designed metrology target 400 exhibiting three design levels 1-3, according to some embodiments of the invention. Basic target structure element 410 is schematically depicted as a square (and may represent any target form or feature such as a grating, a grating line, an area or any form etc.), from which higher level target structure 420 such as a bar (represented as a row of basic elements, i.e. as a row of squares) may be designed ("level 1"). Clearly, higher level target structure 420 may likewise be any type of target structure that is constructed by composition of elements 410 (identical or different elements 410 may be used). Such target structures 420 may themselves be used to define higher level target structures 430 such a grating ("level 2") depicted as a set of bars, i.e. as an array of elemental squares. Any type of higher level target structure 430 may be constructed, from identical or different target structures 420 and target elements 410. A still higher level target may be defined hierarchically as a pattern of gratings ("level 3"), in this case target 400. In each level, lower level structures may be used in their original orientation, in a rotated configuration, a reflected configuration, a swapped configuration etc. The hierarchical definition of the target structures is more efficient with respect to design and design checking and is also compatible with DRC rules applied to the devices themselves and hence more compatible with the lithographic process as a whole. In particular, the design rules checker described above may be more efficiently applied to hierarchically designed metrology targets.

Design files 402 may be generated using operations selected to flatten the hierarchical design in order to simplify processing and production. Such operations maintain the hierarchical target structure but reduce the number of nested design rules. For example, all levels below "Top" level 420 in FIG. 3A may be collapsed recursively to leave cells 410 with no instances that are called by the cell before the operation, and having all objects of these instances as objects of the cell having the appropriate transformation.

Method 401 may thus comprise generating a metrology target design file from a given target design (stage 450), identifying at least one target structure element in the given target design (stage 452), and expressing the given target design as a hierarchical structure with respect to the identified target structure (stage 454).

Advantageously, any process running on the hierarchical design maintains the symmetry by the nature of the design. Asymmetric processes, random grid snap and random errors that might occur and corrupt the characteristic of the cell itself, will not significantly affect the metrology measuring accuracy. Using hierarchically symmetric metrology targets allows separating and thus identifying and measuring asymmetric or random error processes as such.

Advantageously, the inherent hierarchy and symmetry of the designed targets and their design files as well as the high or full compliance of the metrology design files with the device design files, all of which disclosed and enabled in the present invention, overcome and/or avoid the many errors which are introduced during the conventional process of design and insertion of metrology targets. Particularly, the metrology targets designed as disclosed herein, are inherently compatible with specific metrology tool physical and software architecture, due to the disclosed design process. Thereby, any of the following sources of error, or violation of design rules may be overcome and/or avoided: non-compliance with design intent, layer mislabeling, features rotation, offsets modification, shrinking or elimination of features, features reproduction on the wrong design layer or reversal of lithographic polarity etc. Furthermore, the disclosed methods also avoid or overcome errors in the original design synthesis, such as incompatible pitches, duty cycles, and segmentation strategies, as well as in the set up parameters of the metrology tool such as acquisition coordinates, illumination and polarization. Particularly in combination with the verification procedures disclosed below, which may be configured to rely on and utilize the disclosed target design principles, the invention significantly enhances the accuracy of target production and hence of the metrology measurements.

Certain embodiments comprise guidelines or a verification flow designed to assure that the hierarchical structure is maintained all through any process. In further embodiments, handling guidelines are accompanied the delivery of targets from vendor to fab and the creation of target at customer site. Respective guidelines may be used to define possible modifications of the design hierarchy. Method 401 may comprise verifying the targets according to the hierarchical target design rules (stage 440).

Methods and systems of the invention comprise synthesizing metrology target design files 402 in a way that efficient and robust design rule checks at any stage subsequent to design synthesis. Such design files may include in addition to the metrology design, DRC assisting features such as text labels, encapsulations, hierarchy, and auxiliary marker layers. Furthermore, the design rule checks may be performed on the metrology target design file based either on a set of generic design rules which define a particular family or class of metrology targets or generic block design rules, or based on a specific set of target design values which define a particular design file.

Method 401 may comprise applying to a given hierarchical metrology design, rule checks which are based on hierarchical design rules used to generate the given hierarchical metrology design (stage 460), deriving the design rule checks are from at least one metrology criterion, utilizing the hierarchical structure of the metrology design (stage 465) and performing generic metrology design rule violation checks with respect to the hierarchical target structures (stage 467).

For example, method 401 may comprise identifying embedded metrology targets (EMETs) in a design database comprising hierarchical metrology targets (stage 470), identifying instance names and instance orientations of the EMETs (stage 480) and updating input parameters to a metrology measuring tool through a recipe text file that uses a predefined syntax (stage 490). The EMETs may be hierarchical in structure, compatible with DRC rules and comprise at least one target structure element and metrology target structures which are defined using repetitions of the at least one target structure element.

Specifically with respect to EMET (FIG. 3D) method 401 may further comprise updating the metrology measuring tool about the EMET location and current orientation, to eliminate the need for conventional ensuring correct orientation of EMET. A software tool may be built in a way that reads a design database or plurality of designs, and updates input parameters to the metrology measuring tool about EMET residing, location and orientation, in that design or plurality of designs. In certain embodiments, the parsing of design or plurality of designs may be ultra-fast, for example such a process may take time in order of magnitude of minutes for design size in magnitude of 0.1-2.5 cm$^2$. Using future technologies, the read may be shorter. In further embodiment, there is no disclosure of design IP (Intellectual Property). Parsing of design or plurality of designs may not necessarily process any layout objects but instance names and instance orientations only. This is because, when parsing a design file, the parser is tuned to read only the skeleton of cell and omit parsing the content of the design itself. The update of input parameters to the metrology measuring tool may be carried out through proprietary syntax recipe text file.

Current process tool performances are getting significantly enhanced by the adoption of advanced process correction applications such as high order overlay correction for overlay. These process control capabilities require appropriate sampling to be efficient. While it is customary to carry out metrology measurements with metrology targets placed inside the scribe lines, the larger the chip the fewer the scribe lines, and the less relevant is the intra-field sampling. Certain embodiments of the invention overcome shortcomings of conventional EMET strategies. In conventional, physical, swap process, EMET targets are replaced under three conditions: Update EMET design with latest available version; Replace EMET by foundry design if production is out-sourced; ensure correct orientation of EMET in case of IC flipping. An example of the disclosed EMET targets swap flow can be seen in FIG. 3D when compared to FIG. 3C While the updating and the replacing are unavoidable, ensuring correct orientation of EMET involves excessive layout manipulations that for the most part can increase layout database by adding mutations of IC cells or adding level or plurality of hierarchy levels which increase data size and may introduce issues in verification and handling design flow. The sole purpose of ensuring correct orientation of EMET in the prior art is to accommodate the metrology measuring tool preference. Embodiments of the current invention overcome these shortcomings by introducing a method for updating the metrology measuring tool about the EMET location and current orientation (per recipe), and entirely eliminating the need for conventional ensuring correct orientation of EMET.

Advantageously, identifying EMET may provide the following: Reduction of the designer's effort handling EMET; Enablement of fast and simple replacing EMET solely by updating EMET design with latest available version and replacing EMET by foundry design if production is outsourced; Elimination of excessive error prone EMET swap procedure, of ensuring correct orientation of EMET throughout all although holding design block instantiations; Elimination of layout data inflation; and Encouraging introduction of EMET in IC design blocks.

Following are several non-limiting examples of generic metrology design rule violation checks that could be implemented in an automated design rule check application (e.g., Calibre) of a metrology target. The examples relate in a non-limiting manner target 400 having multiple cells comprising grating structures. Exemplary design rule checks may comprise: Coarse bars are of equal width but not equally spaced; Coarse bars are equally spaces but have different width; Bars overlap (spacing<=0); The width of one of the gratings is zero; Width Space >max or <min; The pitch is not the same for both gratings; The pitch is not the same for all X (OR Y) cells; The width of the coarse bar is >max or <min as a function of the pitch; Cells do not have the same offset value; The offsets are not correctly related to the coarse pitch; Cell shape is not according to metrology design rules; Cells are missing and so forth. Following are several non-limiting examples of specific target design values violation checks that could be implemented in an automated design rule check application of a metrology target. The examples relate in a non-limiting manner to target 400 having multiple cells comprising grating structures. Exemplary design values violation checks may comprise: Coarse bar width is different than n micron; Coarse pitch is different than n micron; Cell orientation is not correct; Cell size is different than m micron and so forth.

Methods and systems of the invention further comprise design rule checks and design value violation checks which are similarly defined to any type of target, comprising any type of elements. Furthermore, respective design rule checks may be defined at any or at multiple levels of a hierarchical target design. As an example, generic design rule violation checks that could be implemented in an automated design rule check application of a metrology target block, comprising targets of different classes, acquisition targets and dummy fill, may comprise: Exclusion zone around a target is insufficient; Similar targets are located in insufficient distance; Dummy-fill periodicity interferes with metrology periodicity and so forth. Following are examples of specific target design values violation checks that could be implemented in an automated design rule check application of a metrology target. The examples relate in a non-limiting manner to target 400 having comprising a metrology target block. Examples comprise: The relative position of the targets is not as in recipe; Targets are rotated in the block context; Target checklist match recipe and so forth. It is noted that these examples are non-limiting with respect to target design, design rules and design values and may be configured with respect to specific target and their design rules.

Figure 5A:
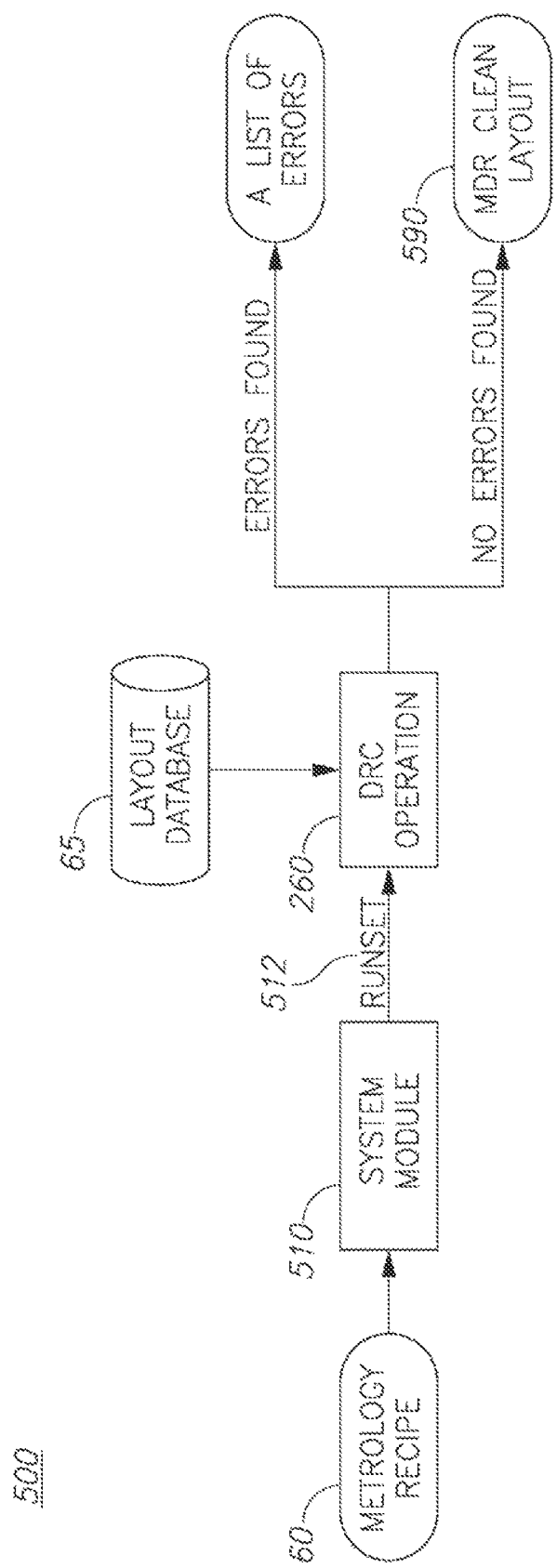
FIG. 5A is a high level schematic block diagram of verification systems, according to some embodiments of the invention.
Figure 5B:
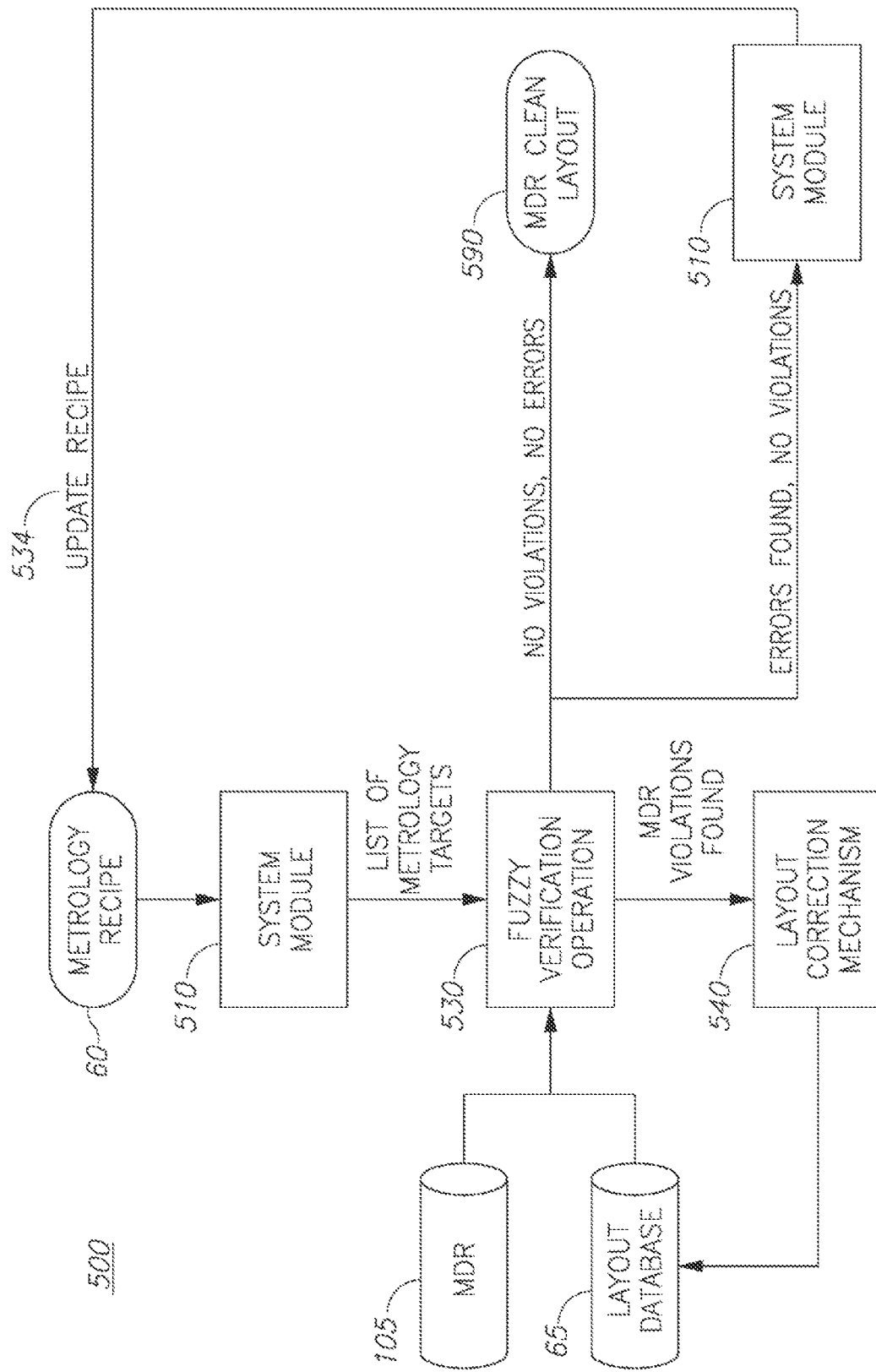
FIG. 5B is a high level schematic block diagram of verification systems, according to some embodiments of the invention.
Figure 5C:
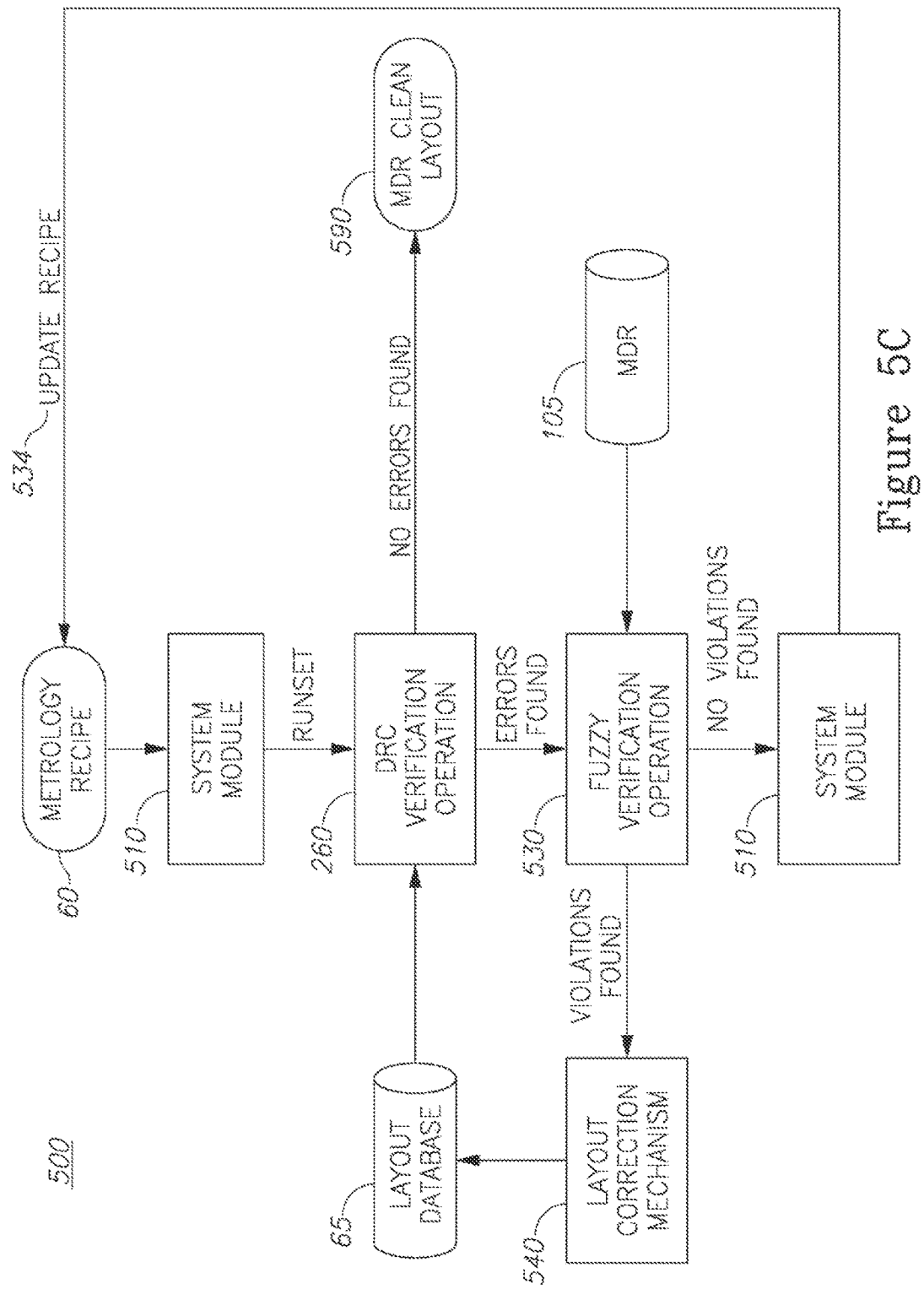
FIG. 5C is a high level schematic block diagram of verification systems, according to some embodiments of the invention.
Figure 5D:
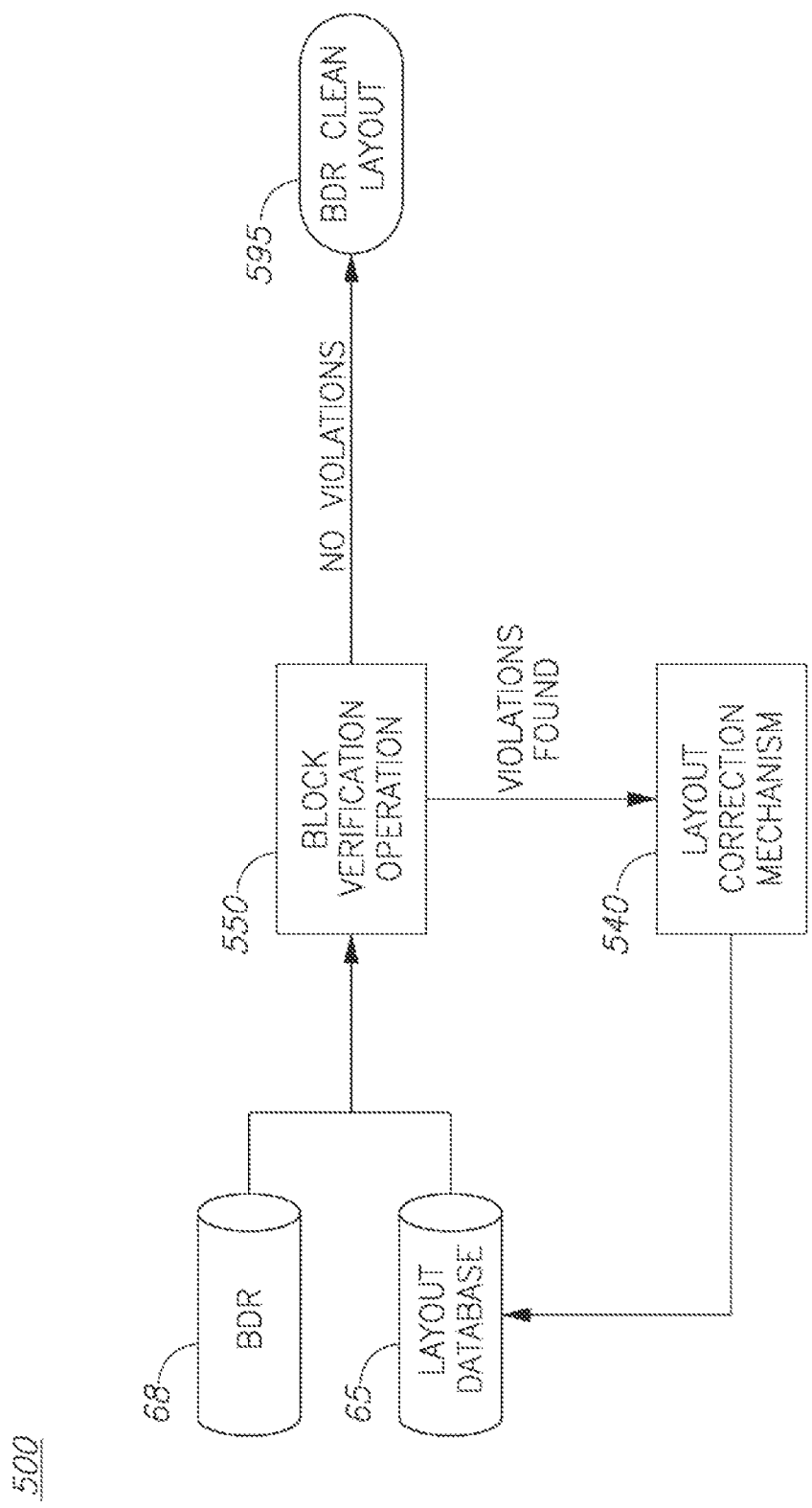
FIG. 5D is a high level schematic block diagram of verification systems, according to some embodiments of the invention.
Figure 5E:
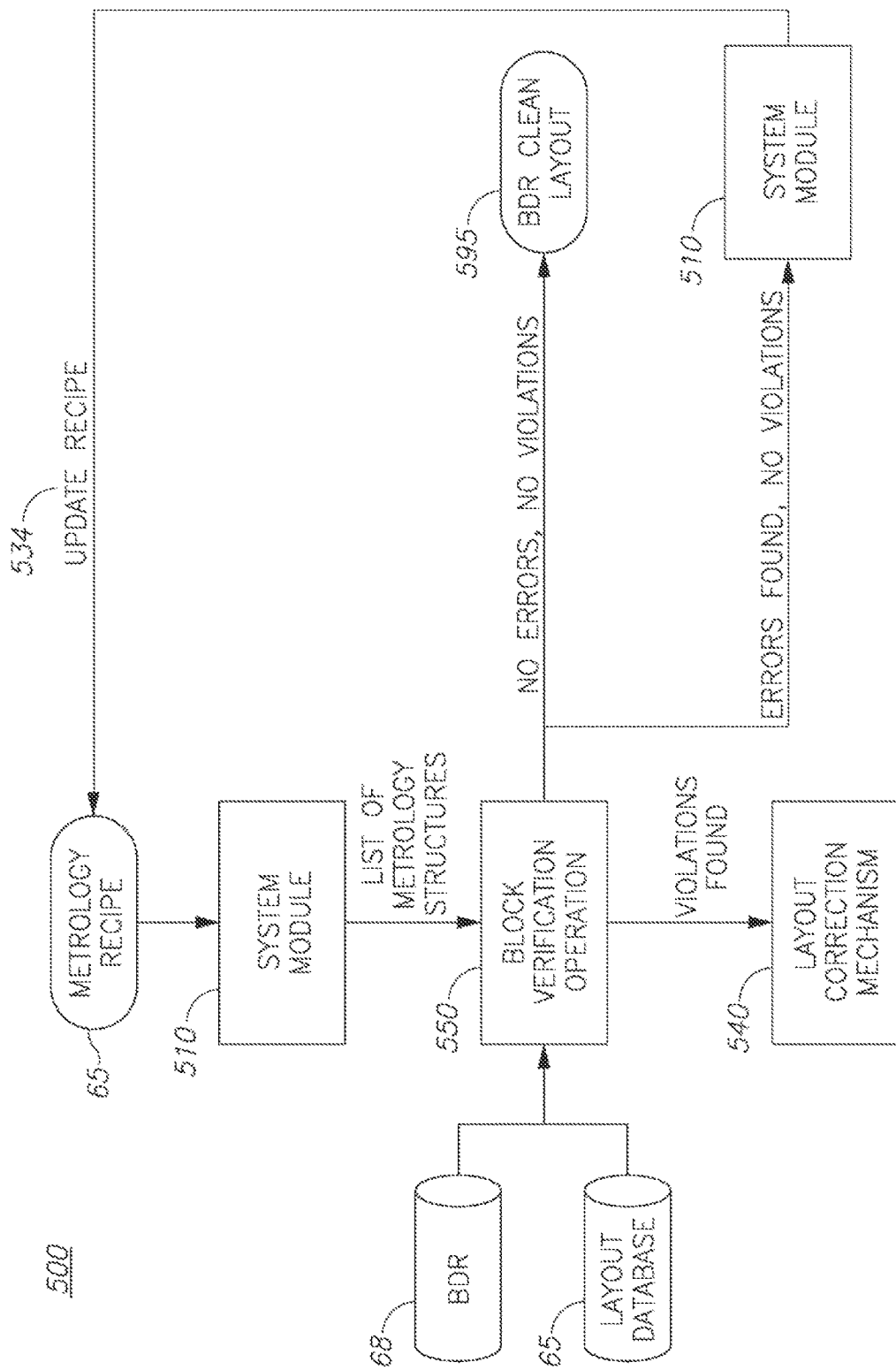
FIG. 5E is a high level schematic block diagram of verification systems, according to some embodiments of the invention.
Figure 5F:
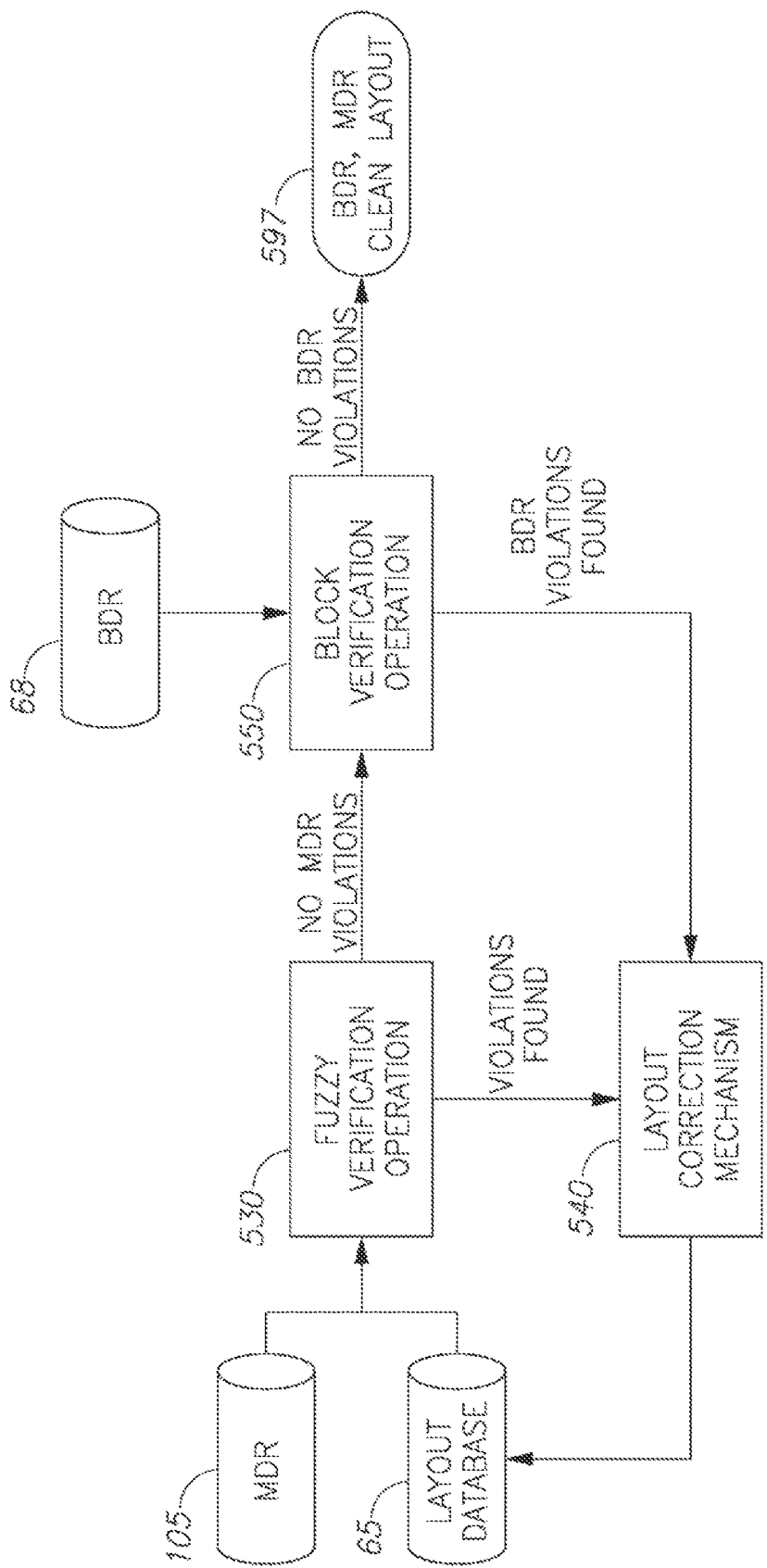
FIG. 5F is a high level schematic block diagram of verification systems, according to some embodiments of the invention.
Figure 5G:
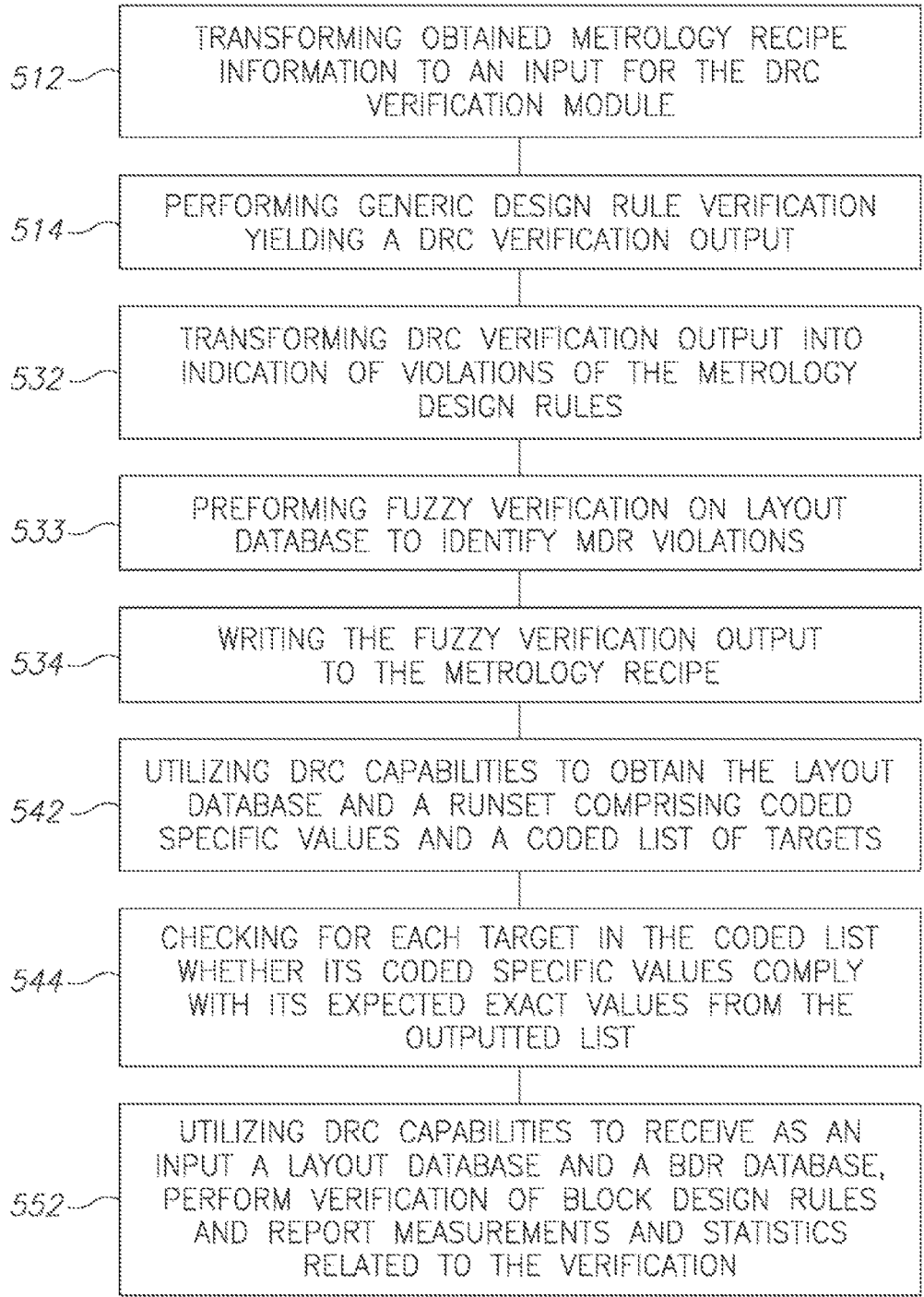
FIG. 5G is a high level schematic flowchart of verification methods, according to some embodiments of the invention.

FIGS. 5A-5G are high level schematic illustrations of verification systems and methods, according to some embodiments of the invention. FIGS. 5A-5F are high level schematic block diagrams of verification systems 500 and FIG. 5G is a high level schematic flowchart of a verification method 501, according to some embodiments of the invention.

Methods and systems of the invention comprise relating to design file 402 as having a specific format such as GDS, which may represent any format used to define deign files. One of the GDS layers may have encoded within it the necessary data which enables a design rule checker such as DRC 260 to read the file and perform appropriate tests to ensure the design file does not violate the embedded design rules. Alternatively or complementarily, the design rule check runset may be generated independently of the target design file and verifies that the target is not in violation of a generic set of design criteria for a particular target family or of BDR (Block design rules). Block Design Rules relate to the pre-measurement step i.e. target acquisition process, adherence to which provides a non-blurry, non-ambiguous input to the metrology measuring tool acquisition process. Such adherence may be provided by systems 500 in addition to the adherence to metrology target design rules which is essential to the ability of the metrology measuring tool to perform. Systems 500 may be configured to perform BDR design rule checks at various stages in the design synthesis and insertion process and possibly to modify metrology recipes to be consistent with the specifics tested metrology target design.

In certain embodiments, the resultant list of BDR or MDR (or both) violations (or other design data that can be determined by DRC 260) may be uploaded to the metrology tool or a metrology tool recipe generation tool in order to create or modify a recipe to be consistent with the specifics of the DRC tested metrology target design and block design. By way of example, if a metrology target which lacks four-fold rotational symmetry has been rotated during insertion, the metrology recipe may be modified to automatically accommodate this rotation. This is of particular importance for target parameters such as layer offsets for which there may be a range of legal values but the metrology recipe must know the exact offset in order to enable accurate metrology.

Advantageously, systems 500 and method 501 provide the following: Verification and inspection of metrology design by utilizing industry standard EDA tools; Capability of real time quality control over metrology design files without knowledge of customer propriety designs; Synthesis of verification-ready metrology design files; and Capability of automated recipe update.

In the following system varieties 500 are schematically illustrated, configured to provide any of: specific design value verification, generic design rule verification, exact design and MDR verification and MDR and/or BDR verification with or without recipe update. The term "violation" is used in the following to refer to a target design which is inconsistent with metrology design rules (MDR), i.e. violates the design rules, and is hence a non-measurable target. The term "error" is used in the following to refer to a target feature which does not violate the design rules but is nevertheless erroneous in that it is different from expected design values according to the metrology recipe, e.g., a feature having a wrong size. Errors require correction of parameters without changing the design, while violations require a revision of target design. The term "fuzzy" is used in the following to refer to verification criteria which relate to target characteristics that are not checked by the design rule checker. Such target characteristics may comprise parameters such as pitch, offset, presence of periodic structures, ranged of spatial frequencies etc. The fuzzy verification operation, referred to as module 530 below, receives MDR database 105 and a layout database 65, and possibly also a metrology recipe 60 as inputs. Fuzzy verification processing comprises scanning layout database 65 and detecting discrepancies from MDR. In addition, fuzzy verification module 530 is configured to detect discrepancies from expected design rules. While examples for DRC verification rules may comprise characteristics such as specific dimensions of features in different layers (e.g., length and widths of bars and spaces in specific layers), examples for fuzzy verification rules may comprise characteristics such as the periodicity of certain structures (is a structure periodic or not), pitch similarity between different structures (do specific gratings have the same pitch within a tolerance range), and the presence of certain parameters within specified ranges.

Certain embodiments, non-limitingly illustrated in FIG. 5A, comprise system 500 for specific design value verification, comprising layout database 65, metrology recipe 60, DRC verification module 260 and a system module 510 which is capable to read metrology recipe 60 and output a list of expected metrology targets and their expected exact values. Utilizing DRC capabilities, DRC verification module 260 is configured to get layout database 65 and a runset 512 with coded specific values and list of target and check for each target in the list that it complies with its expected values. Discrepancies from expected design values produce an error which may be reported as a list of errors, otherwise a MDR clean layout 590 is provided.

Certain embodiments, non-limitingly illustrated in FIG. 5B, comprise system 500 for generic design rule verification comprises layout database 65, metrology design rule (MDR) database 105, metrology recipe 60, system module 510, a fuzzy verification module 530 and a layout correction mechanism 540. Fuzzy verification module 530 is configured to receive as an input layout database 65, MDR database 105 and a list of metrology targets and perform generic design rule verification. System module 510 is configured to transform recipe information to an input for fuzzy verification module 530 and to transform and write fuzzy verification output to recipe 60. If no violations of the metrology design rules are found, system module 510 updates recipe 60 (stage 534). Otherwise, layout correction mechanism 540 may be applied on layout database 65. System 500 may further comprise DRC verification module 260, configured, utilizing DRC capabilities, to obtain layout database 65 and runset 512 comprising coded specific values and a coded list of targets, and to check for each target in the coded list whether its coded specific values comply with its expected exact values from the outputted list, wherein DRC verification module 260 is further arranged to provide results of the checks to system module 510.

Certain embodiments, non-limitingly illustrated in FIG. 5C, comprise system 500 for generic design rule verification comprising layout database 65, metrology design rule (MDR) database 105, metrology recipe 60, fuzzy verification module 530 and layout correction mechanism 540. fuzzy verification module 530 may be configured to receive as an input layout database 65 and MDR database 105 and perform generic design rule verification. In certain embodiments, system 500 may be configured for exact design and MDR verification and comprise layout database 65, metrology design rule (MDR) database 105, metrology recipe 60, fuzzy verification module 530, system module 510, DRC verification module 260 and layout correction mechanism 540. System module 510 reads recipe 60 and outputs a list of targets and their expected parameters. If errors (discrepancies from expected parameters) are produced, the design is checked by fuzzy verification module 530. If no MDR violations are found, system module 510 updates recipe 60, otherwise layout correction mechanism 540 is applied on layout database 65.

Certain embodiments, non-limitingly illustrated in FIG. 5D, comprise system 500 for BDR verification, comprising layout database 65, a block design rule (BDR) database 68, a block verification module 550 and layout correction mechanism 540. Utilizing DRC capabilities, block verification module 550 is configured to receive as an input layout database 65 and BDR database 68 and perform verification of block design rules as well as report measurements and statistics related to the verification. In case violations of block design rules are found, layout database 65 is traversed through layout correction mechanism 540.

Certain embodiments, non-limitingly illustrated in FIG. 5E, comprise system 500 for BDR verification and recipe update, comprising layout database 65, block design rule (BDR) database 68, system module 510, block verification module 550 and layout correction mechanism 540. System module 510 is configured to read metrology recipe 60 and output a list of expected metrology expected exact values such as relative position and orientation as well as updating the recipe with measured values. Utilizing DRC capabilities, block verification module 550 is configured to receive as an input layout database 65, recipe data, and BDR database 68, and perform verification of block design rules as well as reports measurements and statistics. Discrepancies from expected design values produce an error. If an error is reported by block verification module 550, system module 510 updates recipe 65 with measured values (stage 534). If a violation of block design rule(s) is reported, the layout may be traversed through layout correction mechanism 540.

Certain embodiments, non-limitingly illustrated in FIG. 5F, comprise system 500 for MDR and BDR verification with recipe update. System 500 comprises layout database 65, block design rule (BDR) database 68, metrology design rule (MDR) database 105, block verification module 550, fuzzy verification module 530 and layout correction mechanism 540. In exemplary system 500, layout database 65 is first checked for MDR violations and the outputted MDR clean layout is checked by block verification module 540 to yield a MDR and BDR clean layout 597.

Certain embodiments may comprise any operable combination of the modules described above in FIGS. 5A-5F and the accompanying disclosure text.

FIG. 5G is a high level schematic flowchart of method 501, according to some embodiments of the invention. Method 501 may comprise any of the following stages, irrespective of their relative order in the figure. Method 501 may comprise transforming obtained metrology recipe information to an input for the MDR verification module (stage 512), performing generic design rule verification yielding a MDR verification output (stage 514), transforming MDR verification output into indication of violations of the metrology design rules (stage 532), reforming fuzzy verification on layout database to identify MDR violations (stage 533) and writing the fuzzy verification output to the metrology recipe (stage 534).

Method 501 may comprise utilizing DRC capabilities to obtain the layout database and a runset comprising coded specific values and a coded list of targets (stage 542) and checking for each target in the coded list whether its coded specific values comply with its expected exact values from the outputted list (stage 544)

Method 501 may comprise utilizing DRC capabilities to receive as an input a layout database and a BDR database, perform verification of block design rules and report measurements and statistics related to the verification (stage 552) and traversing the layout database through a layout correction mechanism in case violations of block design rules are found (stage 554), Method 501 may comprise reading a metrology recipe and outputting a list of expected metrology exact values (stage 562), and receiving as an input the layout database, recipe data, and the BDR database, verifying block design rules and reporting measurements and statistics (stage 564).

Method 501 may comprise updating the recipe if no violations of the metrology design rules are found (stage 584), applying a layout correction mechanism on the layout database if such violations are found (stage 586) and upon detecting discrepancies from expected design values, updating the recipe with measured values (stage 588).

In the above description, an embodiment is an example or implementation of the invention. The various appearances of "one embodiment", "an embodiment", "certain embodiments" or "some embodiments" do not necessarily all refer to the same embodiments.

Although various features of the invention may be described in the context of a single embodiment, the features may also be provided separately or in any suitable combination.

Conversely, although the invention may be described herein in the context of separate embodiments for clarity, the invention may also be implemented in a single embodiment.

Certain embodiments of the invention may include features from different embodiments disclosed above, and certain embodiments may incorporate elements from other embodiments disclosed above. The disclosure of elements of the invention in the context of a specific embodiment is not to be taken as limiting their used in the specific embodiment alone.

Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described.

Meanings of technical and scientific terms used herein are to be commonly understood as by one of ordinary skill in the art to which the invention belongs, unless otherwise defined.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. An in-die metrology method comprising:
    identifying, with one or more processors, one or more candidate device structures from a plurality of device structures within a designed sample layout as candidate device metrology targets, wherein the one or more candidate device metrology targets satisfy one or more metrology design rules, wherein the one or more candidate device metrology targets are located within a die of the designed sample layout;
    determining, with one or more processors, one or more predicted metrology signals by simulating metrology measurements of the one or more candidate device metrology targets with at least one selected configuration of a metrology tool;
    filtering, with one or more processors, the one or more candidate device metrology targets to select one or more device metrology targets based on the one or more predicted metrology signals; and
    providing the one or more device metrology targets to the metrology tool for metrology measurements of the one or more device metrology targets on at least one sample produced according to the designed sample layout.

2. The in-die metrology method of claim 1, further comprising:
    filtering, with one or more processors, the candidate device metrology targets to select the one or more device metrology targets based on designed functions of the one or more candidate device metrology targets.

3. The in-die metrology method of claim 1, wherein determining the one or more predicted metrology signals by simulating metrology measurements of the one or more candidate device metrology targets with at least one selected configuration of a metrology tool comprises:
    determining the one or more predicted metrology signals by simulating metrology measurements of the one or more candidate device metrology targets with at least one selected configuration of a metrology tool based on predicted physical attributes of the candidate device metrology targets.

4. The in-die metrology method of claim 1, wherein determining the one or more predicted metrology signals by simulating metrology measurements of the one or more candidate device metrology targets with at least one selected configuration of a metrology tool comprises:
    determining the one or more predicted metrology signals by simulating metrology measurements of the one or more candidate device metrology targets fabricated according to at least one process design rule.

5. The in-die metrology method of claim 1, wherein filtering the one or more candidate device metrology targets comprises:
    filtering the candidate device metrology targets based on at least one metrology sampling requirement.

6. The in-die metrology method of claim 1, wherein the metrology design rules comprise:
    at least one of feature symmetry, feature size, feature periodicity, or an offset between centers of symmetry of features.

7. The in-die metrology method of claim 1, wherein the designed sample layout includes at least two layers and the identifying the candidate device structures from a plurality of device structures within a designed sample layout as candidate device metrology targets comprises:
    identifying at least a first candidate device structure in a first layer of the two or more layers and at least a second candidate device structure in a second layer of the two or more layers, wherein the first candidate structure and the second candidate structure are colocated.

8. The in-die metrology method of claim 1, wherein the designed sample layout includes at least two layers and the identifying the candidate device structures from a plurality of device structures within a designed sample layout as candidate device metrology targets comprises:
    identifying at least a first candidate device structure in a first layer of the two or more layers and at least a second candidate device structure in a second layer of the two or more layers, wherein the first candidate structure and the second candidate structure have a selected spatial relationship.

9. The in-die metrology method of claim 1, wherein filtering the one or more candidate device metrology targets comprises:
    filtering the candidate device metrology targets based on a Depth of Focus (DoF) scanner sampling requirement.

10. The in-die metrology method of claim 1, further comprising:
   measuring, with the metrology tool, at least one metrology measurement on the one or more device metrology targets on the at least one sample produced according to the designed sample layout.

11. An in-die metrology system comprising:
   a metrology tool; and
   a controller communicatively coupled to the metrology tool, the controller including one or more processors configured to execute program instructions configured to cause the one or more processors to:
      identify one or more candidate device structures from a plurality of device structures within a designed sample layout as candidate device metrology targets, wherein the one or more candidate device metrology targets satisfy one or more metrology design rules, wherein the one or more candidate device metrology targets are located within a die of the designed sample layout;
      determine one or more predicted metrology signals by simulating metrology measurements of the one or more candidate device metrology targets with at least one selected configuration of a metrology tool;
      filter the one or more candidate device metrology targets to select one or more device metrology targets based on the one or more predicted metrology signals; and
      provide the one or more device metrology targets to the metrology tool for metrology measurements of the one or more device metrology targets on at least one sample produced according to the designed sample layout.

12. The in-die metrology system of claim 11, wherein the one or more processors are further configured to execute program instructions configured to cause the one or more processors to:
   filter the candidate device metrology targets based on designed functions of the one or more candidate device metrology targets.

13. The in-die metrology system of claim 11, wherein determining the one or more predicted metrology signals by simulating metrology measurements of the one or more candidate device metrology targets with at least one selected configuration of the metrology tool comprises:
   determining the one or more predicted metrology signals by simulating metrology measurements of the one or more candidate device metrology targets with at least one selected configuration of a metrology tool based on predicted physical attributes of the candidate device metrology targets.

14. The in-die metrology system of claim 11, wherein determining the one or more predicted metrology signals by simulating metrology measurements of the one or more candidate device metrology targets with at least one selected configuration of the metrology tool filtering the one or more candidate device metrology targets comprises:
   determining the one or more predicted metrology signals by simulating metrology measurements of the one or more candidate device metrology targets fabricated according to at least one process design rule.

15. The in-die metrology system of claim 14, wherein the at least one process design rule comprises:
   at least one of topography or process stack information of the one or more candidate device metrology targets.

16. The in-die metrology system of claim 11, wherein filtering the one or more candidate device metrology targets comprises:
   filtering the candidate device metrology targets based on at least one metrology sampling requirement.

17. The in-die metrology system of claim 16, wherein the at least one metrology sampling requirement comprises:
   a number of degrees of freedom of at least one of a scanner or an exposure tool.

18. The in-die metrology system of claim 11, wherein the metrology design rules comprise:
   at least one of feature symmetry, feature size, feature periodicity, or an offset between centers of symmetry of features.

19. The in-die metrology system of claim 11, wherein the designed sample layout includes at least two layers and the identifying the candidate device structures from a plurality of device structures within a designed sample layout as candidate device metrology targets comprises:
   identifying at least a first candidate device structure in a first layer of the two or more layers and at least a second candidate device structure in a second layer of the two or more layers, wherein the first candidate structure and the second candidate structure are colocated.

20. The in-die metrology system of claim 11, wherein the designed sample layout includes at least two layers and the identifying the candidate device structures from a plurality of device structures within a designed sample layout as candidate device metrology targets comprises:
   identifying at least a first candidate device structure in a first layer of the two or more layers and at least a second candidate device structure in a second layer of the two or more layers, wherein the first candidate structure and the second candidate structure have a selected spatial relationship.

21. The in-die metrology system of claim 11, wherein filtering the one or more candidate device metrology targets comprises:
   filtering the candidate device metrology targets based on a Depth of Focus (DoF) scanner sampling requirement.

22. The in-die metrology system of claim 13, wherein the one or more predicted physical attributes of the candidate device metrology targets comprise:
   device architectures of the one or more candidate device metrology targets.

23. The in-die metrology system of claim 11, wherein the one or more processors are further configured to execute program instructions configured to cause the one or more processors to:
   filter the candidate device metrology targets based on a predicted risk of radiation from the metrology tool inducing at least one of structural or functional modification of the candidate device metrology targets.

24. The in-die metrology system of claim 11, wherein the at least one selected configuration of the metrology tool comprises:
   at least one of an illumination intensity, a spectral range, or an angle of incidence of illumination from the metrology tool on the candidate device metrology targets.

25. The in-die metrology system of claim 11, wherein the at least one selected configuration of the metrology tool comprises:
   at least one of a phase measurement capability or a noise model of the metrology tool.

* * * * *